United States Patent [19]
Ferrell et al.

[11] Patent Number: 6,119,366
[45] Date of Patent: *Sep. 19, 2000

[54] CHEMICAL DRYING AND CLEANING METHOD

[76] Inventors: Gary W. Ferrell, 608 Terrace Ave., Half Moon Bay, Calif. 94019; Robert J. Elson, 601 Bryson; John F. Schipper, 3133 Flowers, both of Palo Alto, Calif. 94306

[ * ] Notice: This patent is subject to a terminal disclaimer.

[21] Appl. No.: 09/109,460

[22] Filed: Jul. 2, 1998

Related U.S. Application Data

[63] Continuation of application No. 09/034,369, Mar. 3, 1998, Pat. No. 5,974,681.

[51] Int. Cl.[7] .................................................. F26B 3/00
[52] U.S. Cl. ................................. 34/340; 34/342; 34/401
[58] Field of Search .............................. 34/329, 330, 337, 34/340, 342, 357, 358, 372, 401; 134/21, 25.4, 255, 20

[56] References Cited

U.S. PATENT DOCUMENTS

| | | | |
|---|---|---|---|
| 5,571,337 | 11/1996 | Mohindra et al. | 134/25.4 |
| 5,685,086 | 11/1997 | Ferrell | 34/61 |
| 5,685,327 | 11/1997 | Mohindra et al. | 134/95.2 |
| 5,776,296 | 7/1998 | Matthews | 134/102.2 X |

*Primary Examiner*—Stephen Gravini
*Attorney, Agent, or Firm*—John Schipper

[57] ABSTRACT

Method and apparatus for drying and/or cleaning a workpiece, such as an electronic part, semiconductor wafer, printed circuit board or the like. As the workpiece is withdrawn from a processing liquid, a selected drying liquid, such as hydrofluoroether (HFE), ethylated HFE, an HFE azeotrope or an ethylated HFE azeotrope, that has a very small surface tension, is volatile, and has a density that is greater than the processing liquid density, is sprayed on, dribbled on or otherwise transferred to an exposed surface of the workpiece. The exposed surface may be stationary, may be rotating or may be moving along a selected path. The workpiece can be dried in 5–60 seconds, or less, in most situations and can be cleaned using the invention. Drying and/or cleaning can be performed in a single workpiece process, a single workpiece continuous process or a batch process.

44 Claims, 12 Drawing Sheets

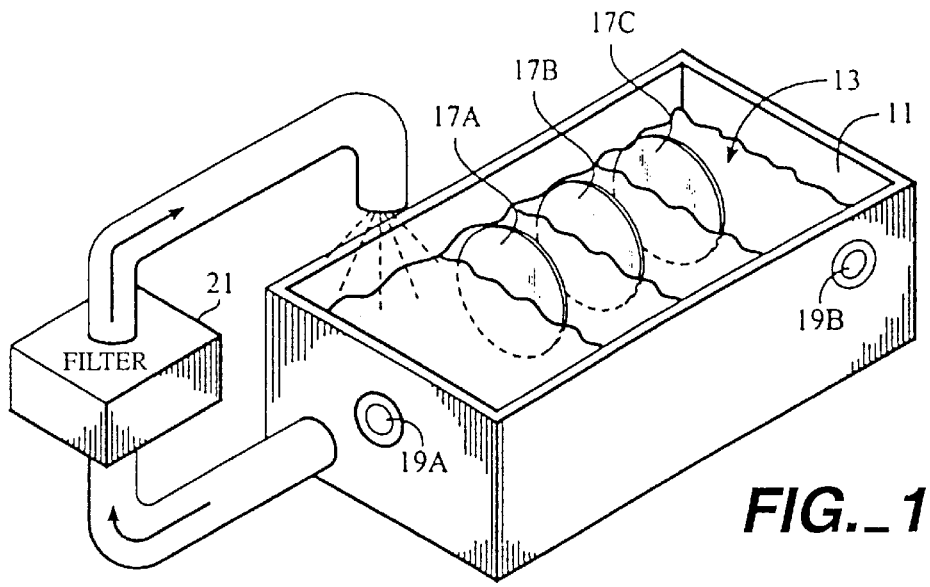
FIG._1
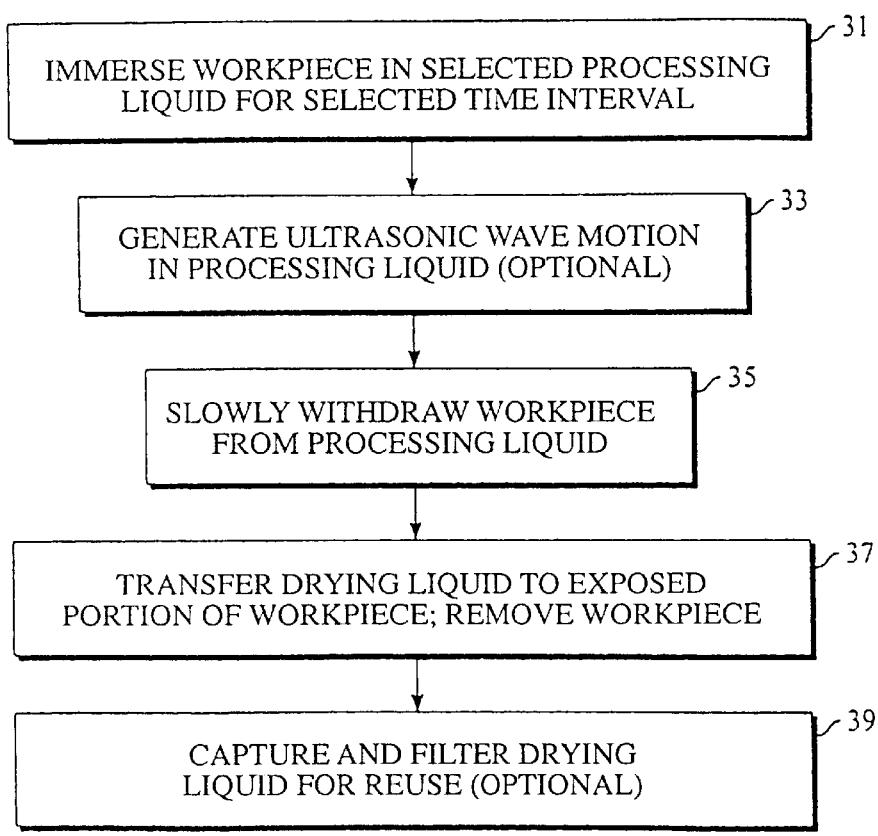
FIG._3

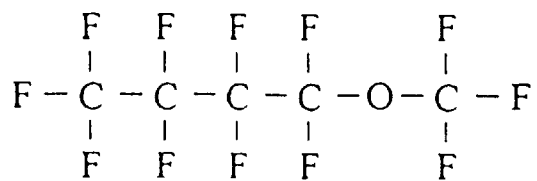
FIG._2A
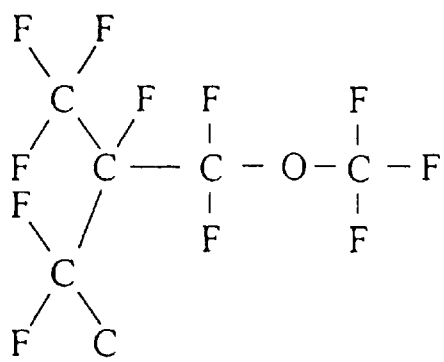
FIG._2B
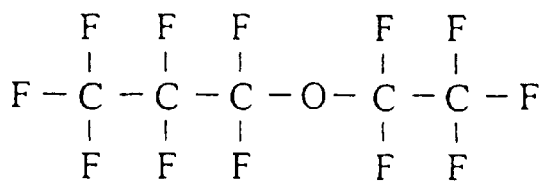
FIG._2C
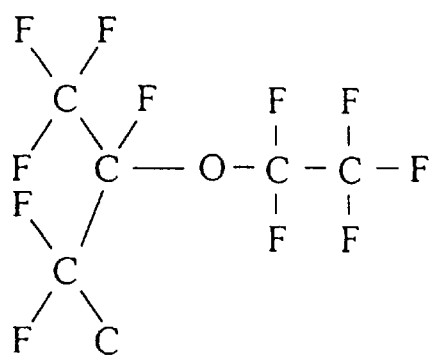
FIG._2D

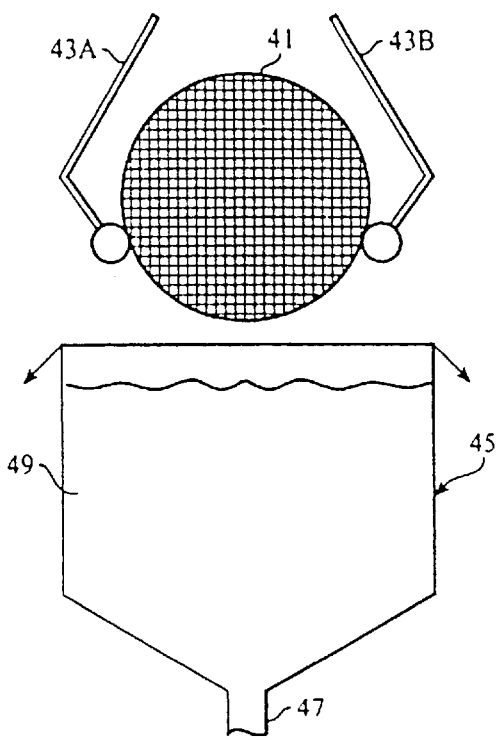
FIG._4A
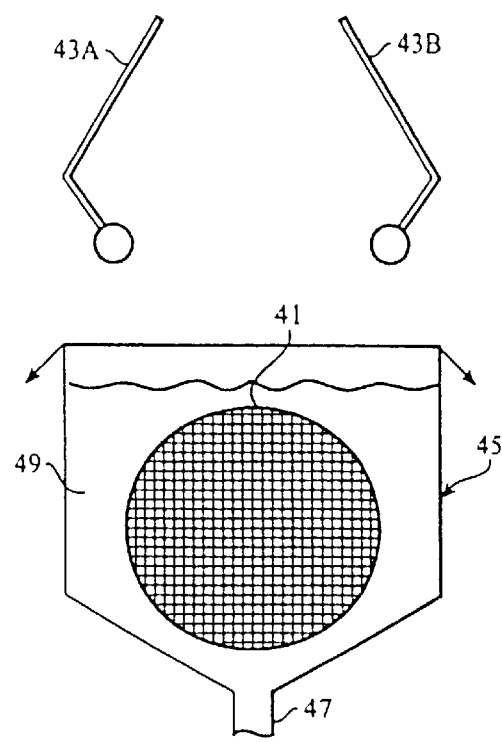
FIG._4B
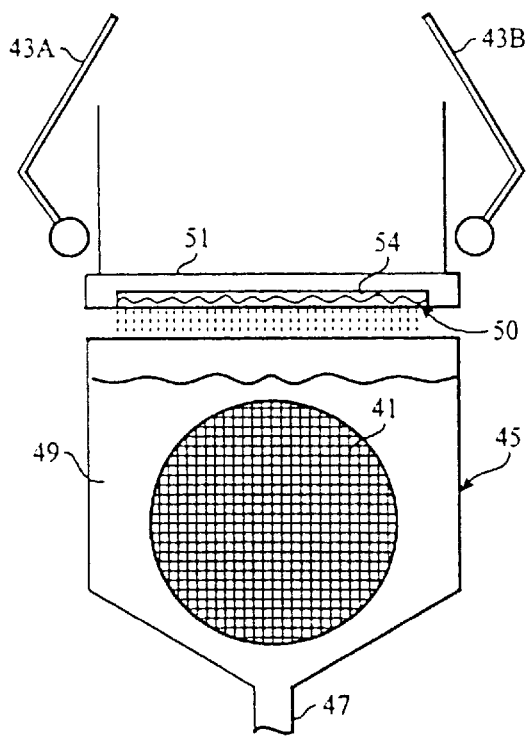
FIG._4C
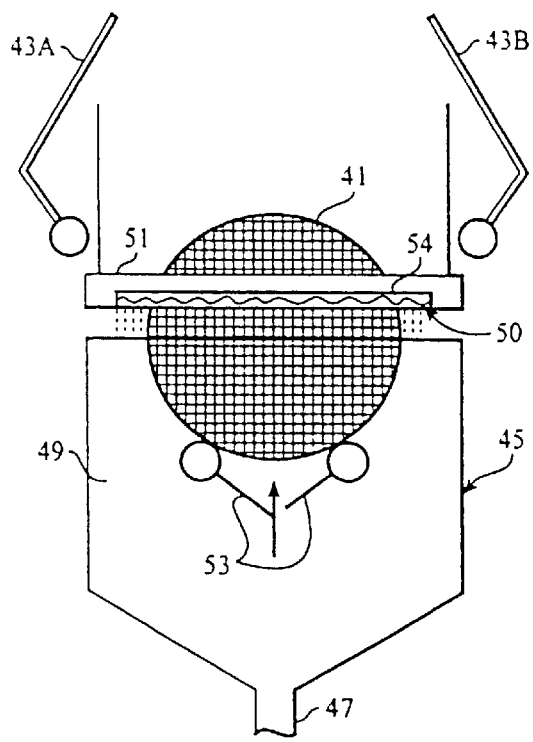
FIG._4D

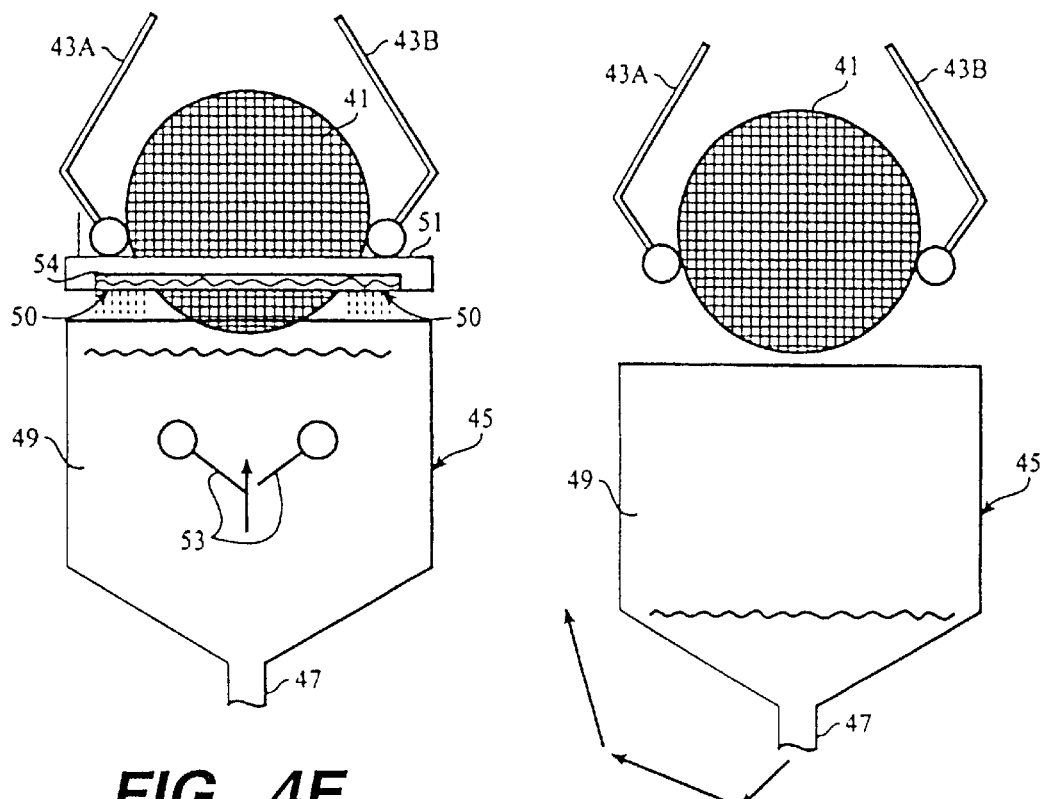
FIG._4E
FIG._4F
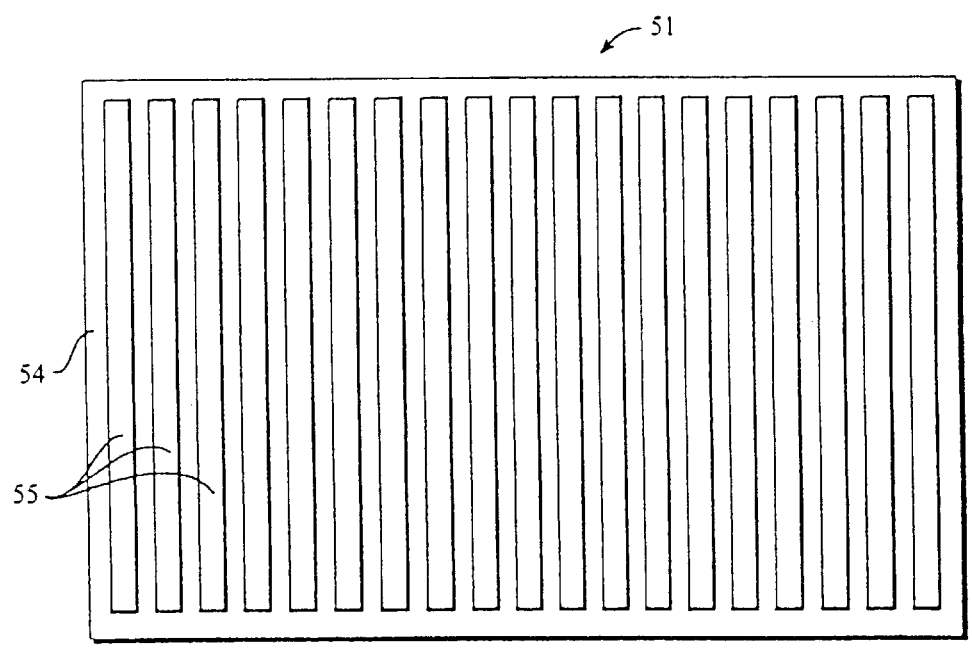
FIG._5

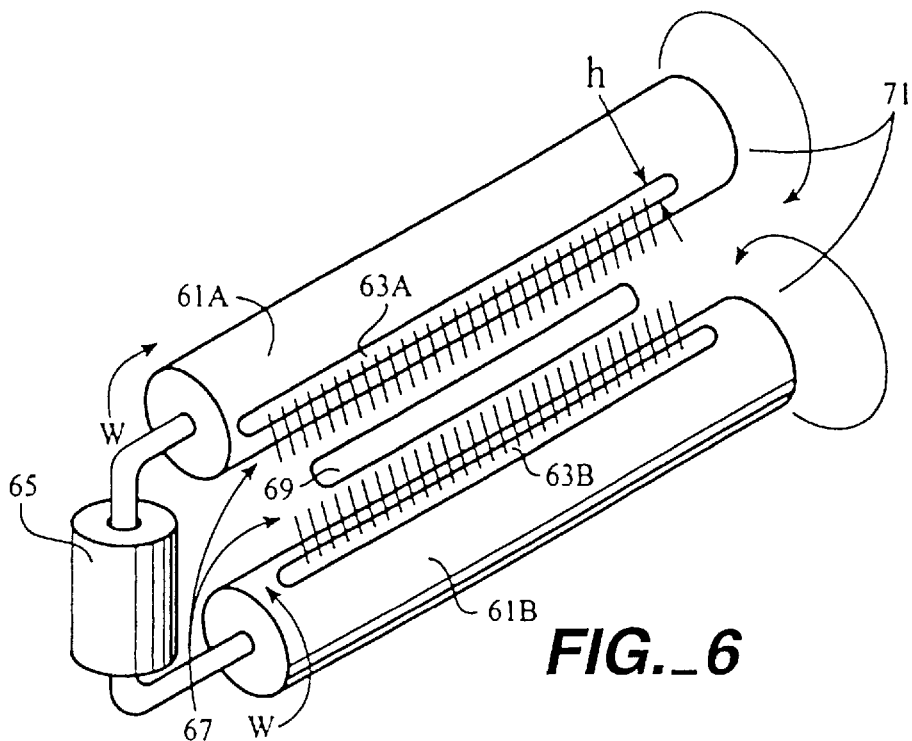
FIG._6
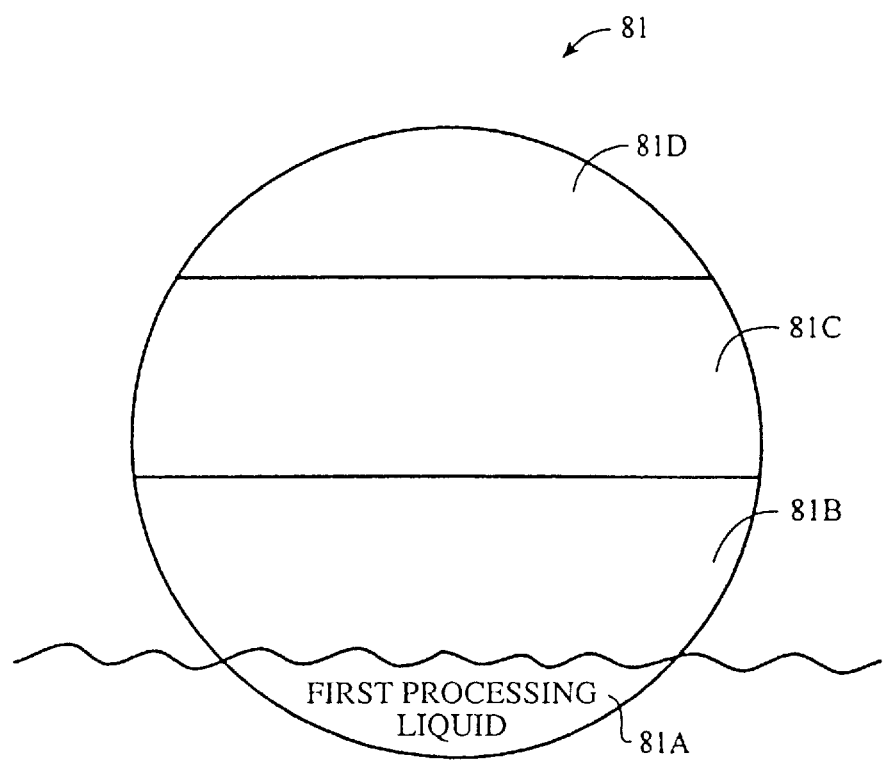
FIG._7

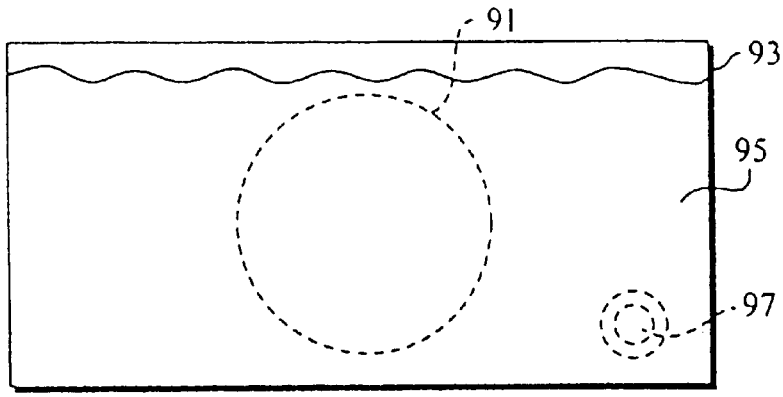
FIG._8A
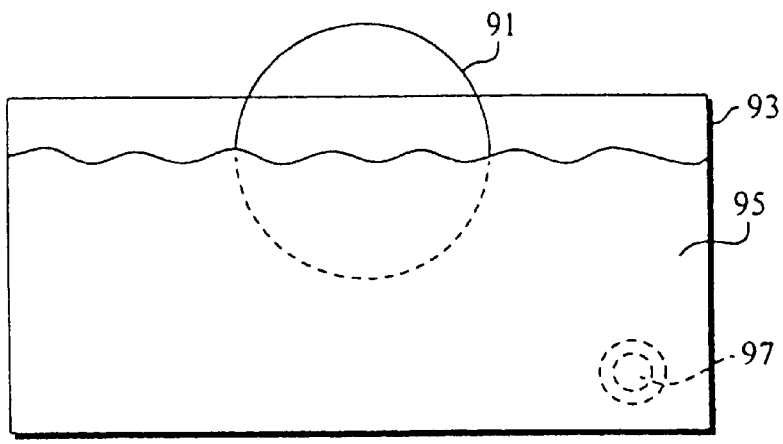
FIG._8B
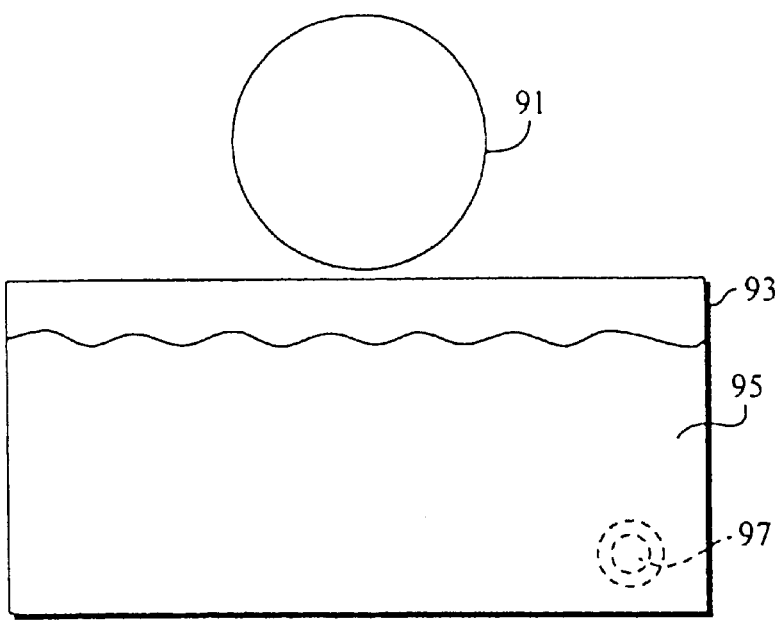
FIG._8C

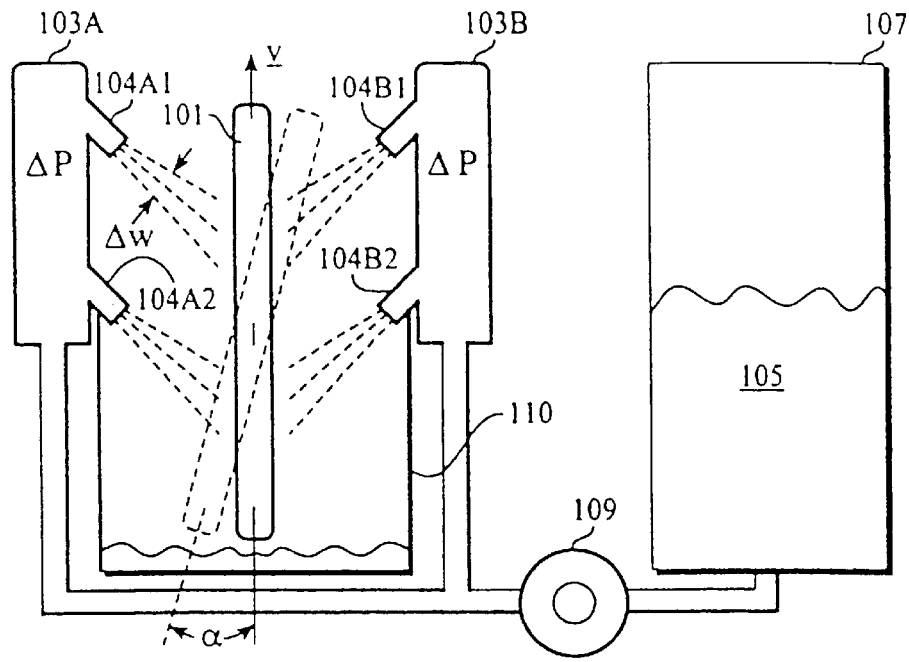
FIG._9
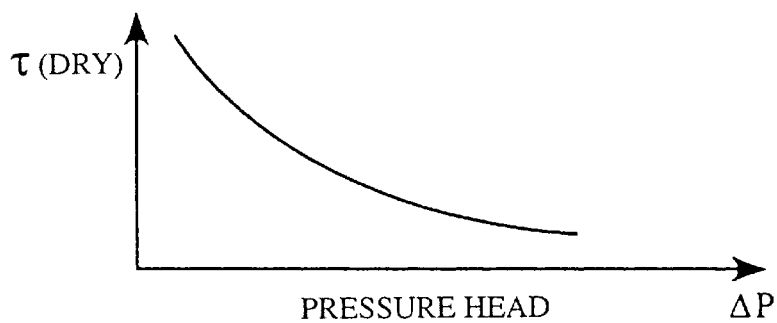
FIG._10
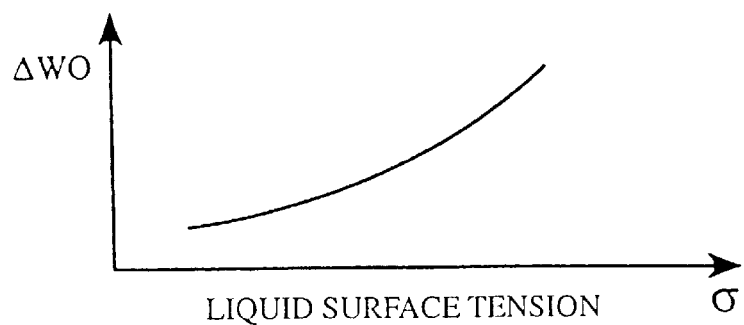
FIG._11

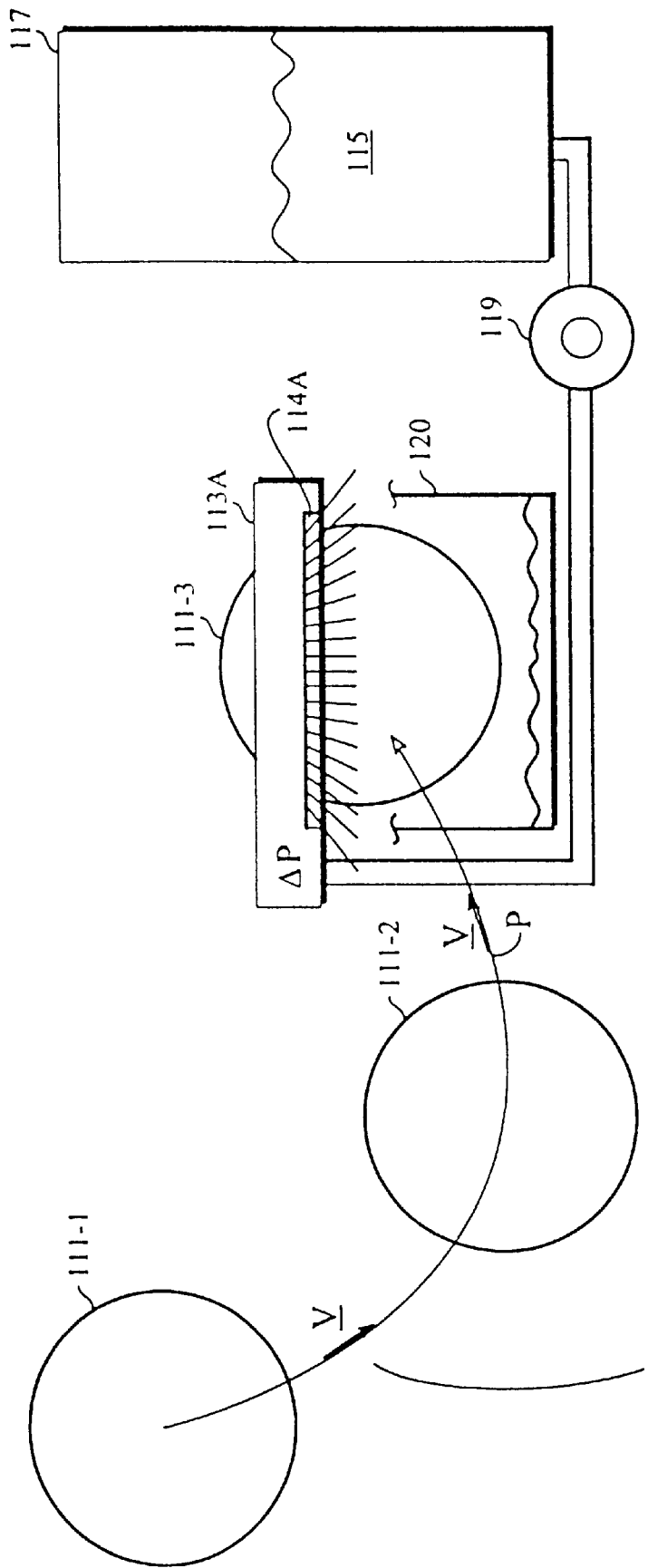
FIG._12

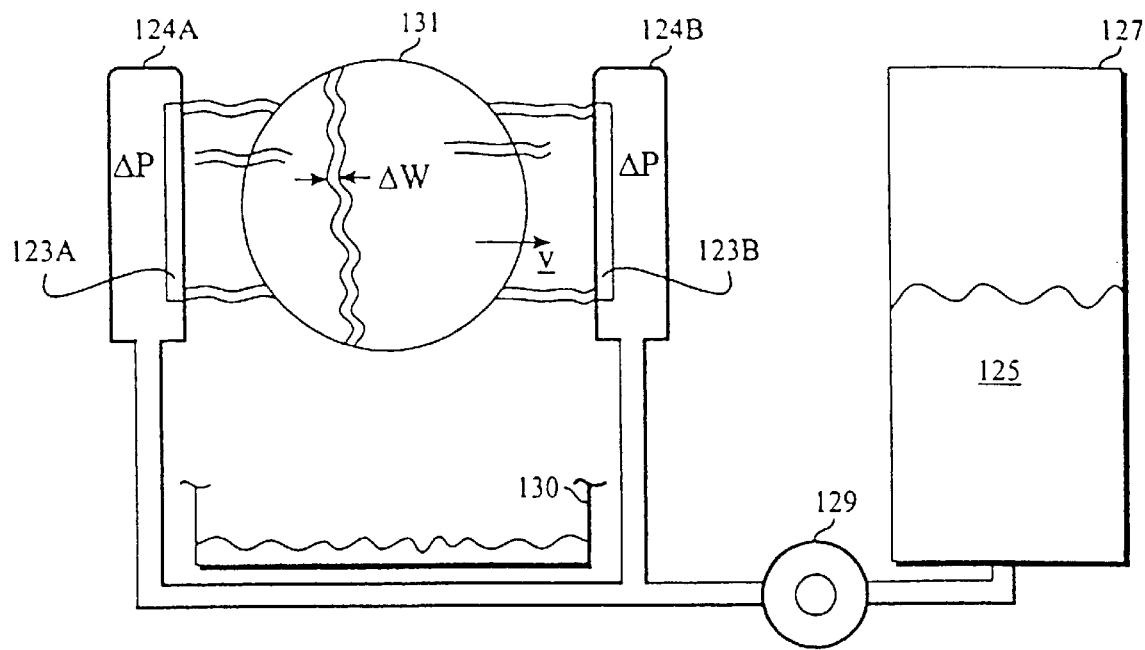
FIG._13
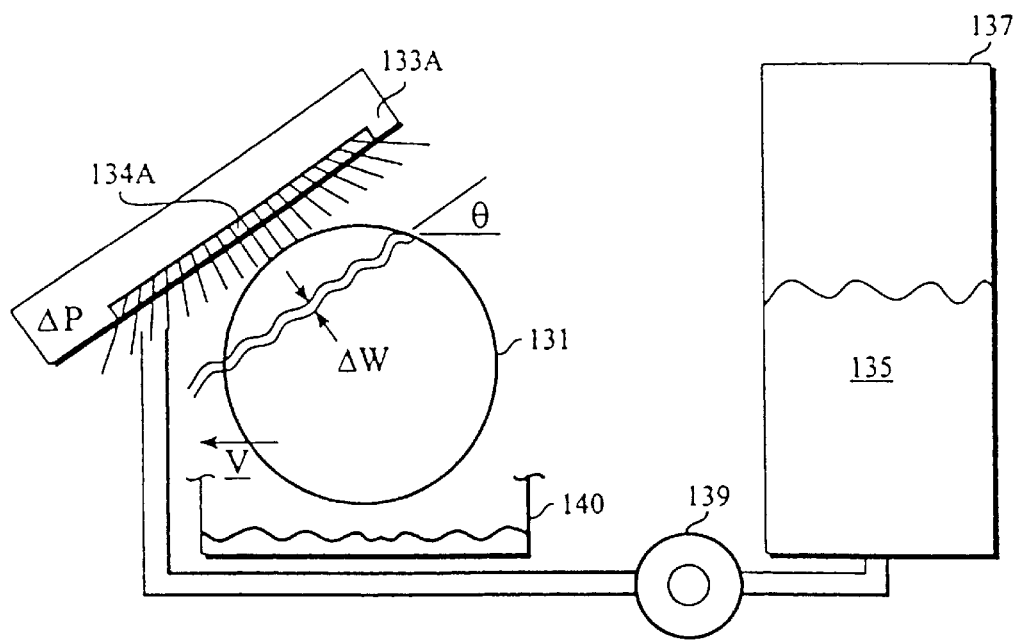
FIG._14

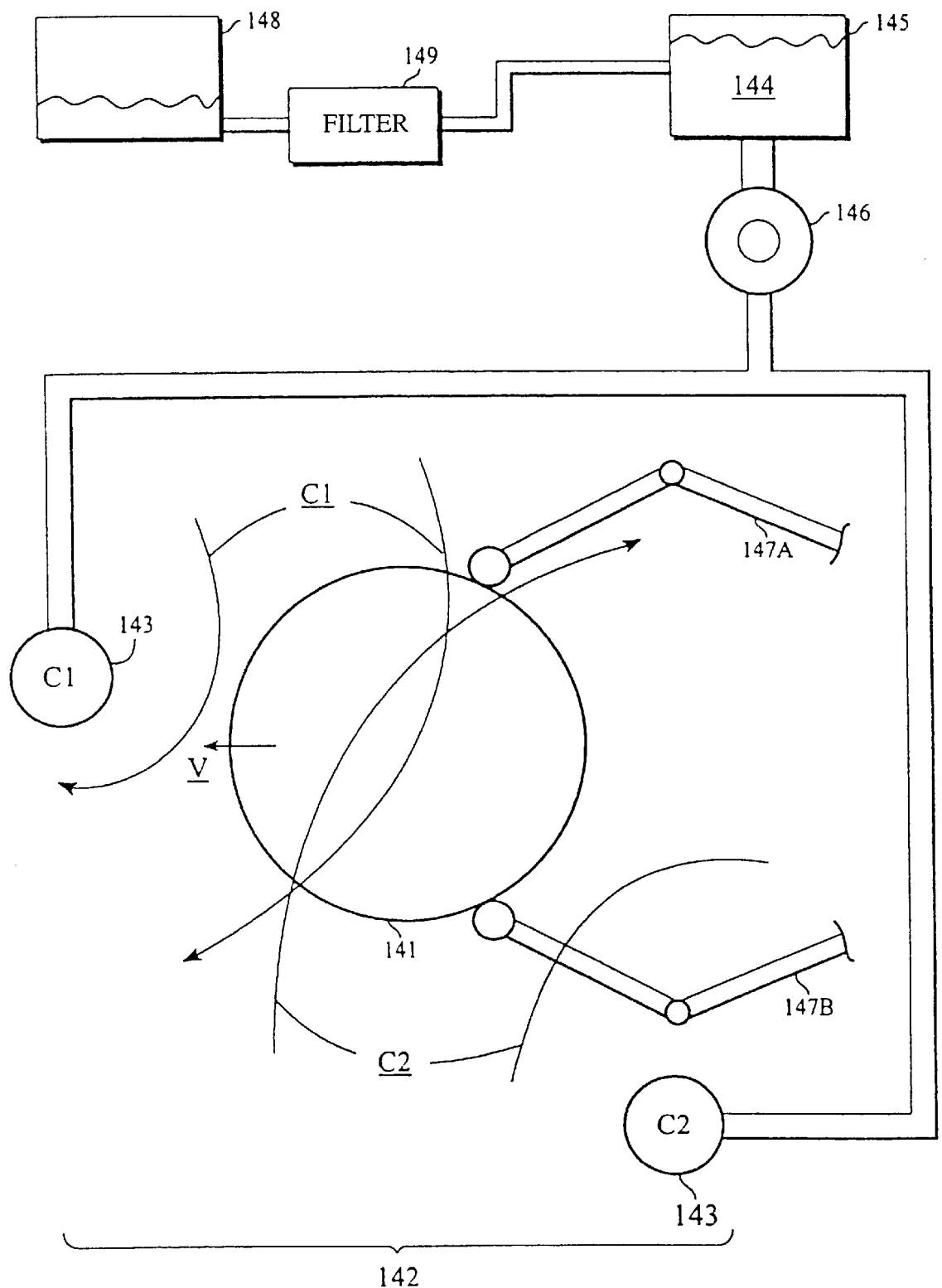
FIG._15

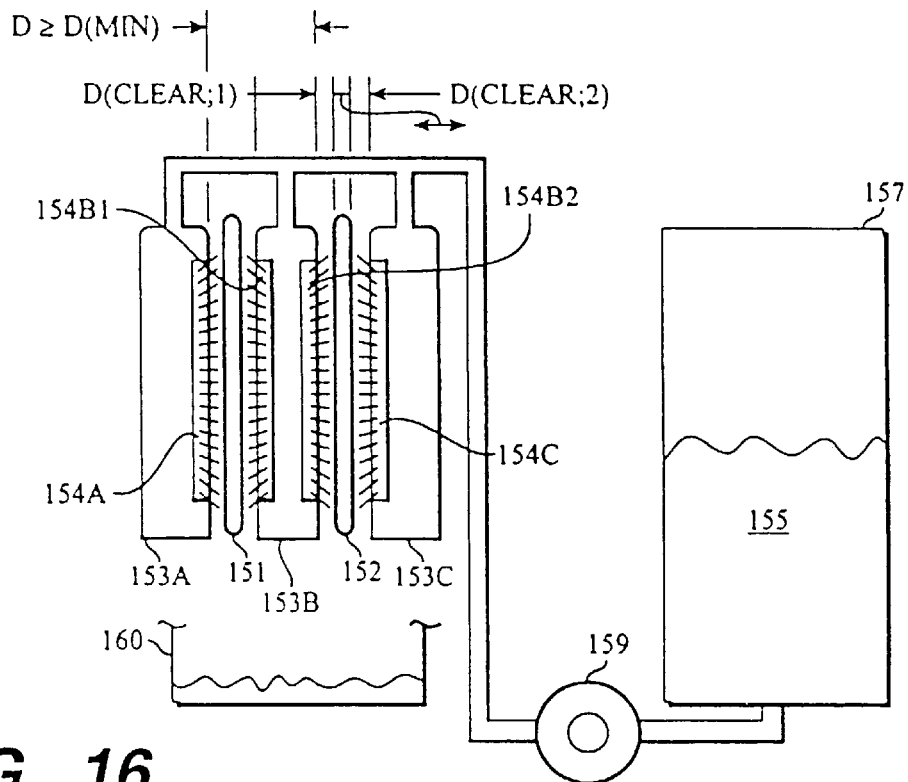
FIG._16
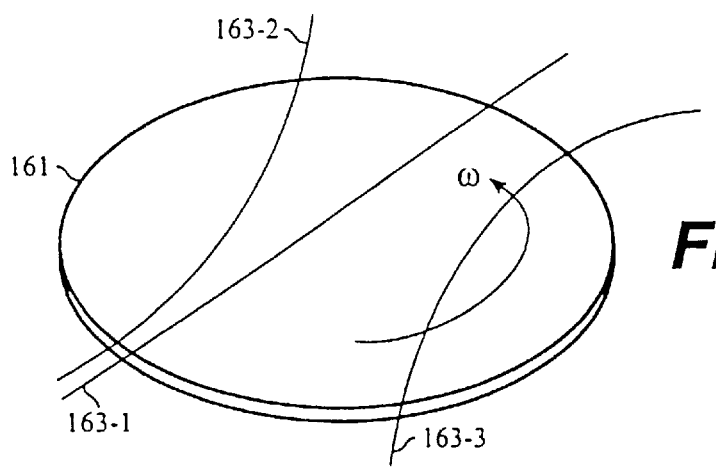
FIG._17A
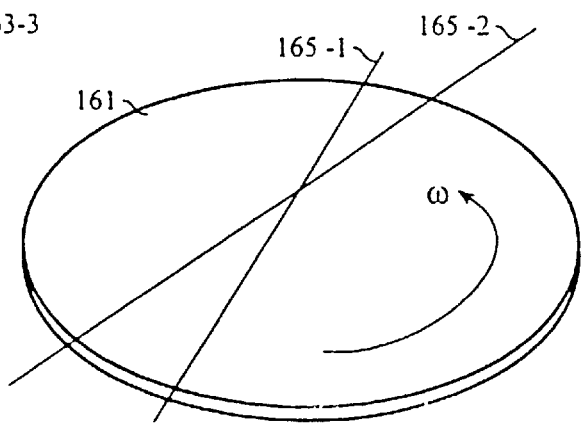
FIG._17B

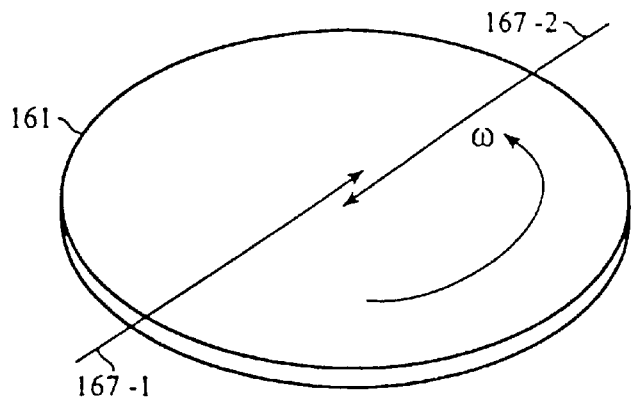
FIG._17C
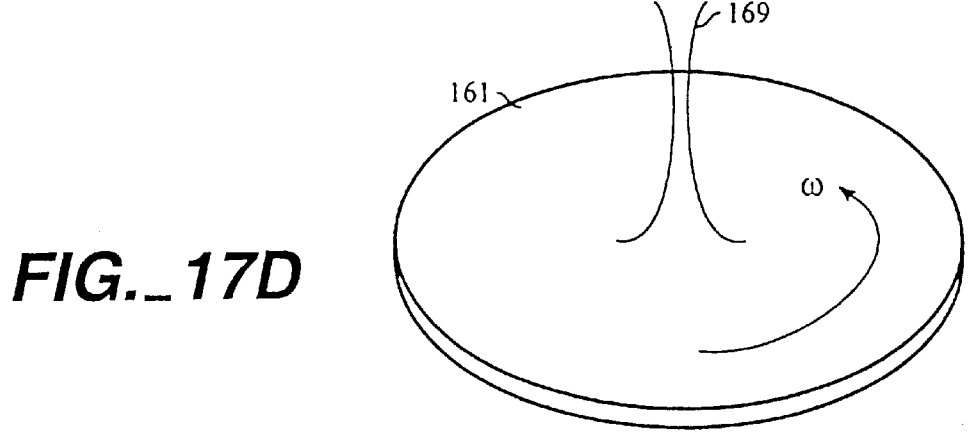
FIG._17D
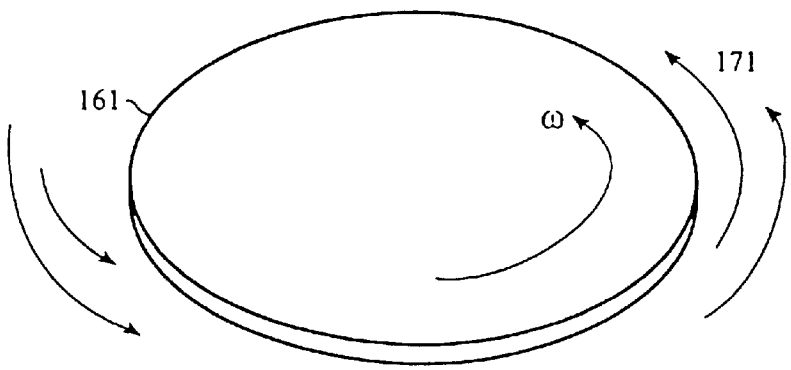
FIG._17E

CHEMICAL DRYING AND CLEANING METHOD

FIELD OF THE INVENTION

This is a Continuation In Part of U.S. Ser. No. 08/034,369, filed on Mar. 3, 1998. This invention relates to a chemical system for drying and/or cleaning semiconductor, optical, electronic and other surfaces.

BACKGROUND OF THE INVENTION

In fabrication of a semiconductor wafer, an electrical or optical component or a printed circuit board, a workpiece will be subjected to one or more cleaning and drying processes in which, ideally, all foreign substances that are not intended to be incorporated in the workpiece are removed. Chemical baths containing strong acids, strong bases or oxidizers, such as HCl, $H_2SO_4$, $HNO_3$, $H_2PO_3$, HF, $NH_4OH$ and $H_2O_2$, are often used as part of a cleaning process. These substances are often toxic, chemically reactive, corrosive and/or bioaccumulative and must be handled and disposed of as hazardous substances.

Several workers have disclosed methods for drying parts, including integrated circuits, by use of heated or superheated gases. One attractive method uses a drying vapor of heated isopropanol (IPA), which forms a minimum boiling azeotrope with water and is believed to displace water from the wafer surfaces, and the vapor flows into the vessel at one end and simultaneously flows out of the vessel at another end.

Other workers have disclosed use of a plurality of megasonic beam transducers, located at staggered positions, for cleaning wafers. Each transducer emits a vibratory megasonic beam with an unspecified (very high) frequency in a fixed direction, and the transducer locations are chosen so that the collection of beams irradiate, and thereby clean, all wafer surfaces in a chamber, no matter how the wafers are arranged.

Use of ultrasonic transducers in a chemical cleaning bath to cooperatively remove contaminants and unwanted material layers from semiconductor wafers, medical instruments and other objects of interest is disclosed by other workers. Still other workers have disclosed use of ultrasonic transducers to coat, spray, deposit or otherwise apply a desired material to an object surface, or for ultrasonic fogging.

These approaches use heated or superheated gases or direct beam irradiation to dry or clean an object surface; or they use cooperative action by an ultrasonic beam and an active chemical bath to remove contaminants from, or to apply a desired material to, an object surface. These approaches are complex, usually require operation at high temperatures, often require processing times of one to several minutes, and often require use of specially resistant chamber walls for the processing chamber. The chemicals used are often designated as hazardous substances, requiring special handling.

What is needed is a system that uses non-hazardous substances for chemically cleaning and/or drying workpieces and that is reasonably effective for removing substantially all foreign substances with diameters above a range of sizes, such as 0.1–0.5 µm. Preferably, the system should also be effective for removing liquids from and drying and cleaning workpieces in relatively short time intervals. Preferably, the chemicals used should be recyclable and the energy requirements for the cleaning or drying process should be modest.

SUMMARY OF THE INVENTION

These needs are met by the invention, which provides a system for drying and/or cleaning foreign substances from selected surfaces of a workpiece, such as a semiconductor wafer, an electrical or optical component, or a printed circuit board, including a selected liquid such as hydrofluoroether (HFE), ethylated hydrofluoroether (denoted eth-HFE) or a mixture of hydrofluoroether or ethylated hydrofluoroether with one or more other chemicals. A first processing liquid is prepared at a temperature in a selected range, such as T(bath)=10–90° C., in a tank or other liquid housing, and the workpiece is fully immersed in a first liquid processing bath, or otherwise exposed to the first processing liquid, for a selected time interval. The invention works well, for example, at room temperature. Optionally, the processing liquid is subjected to wave motion through ultrasonic waves at one or more selected frequencies introduced into the liquid. The workpiece is drawn through a second processing liquid at a selected linear withdrawal rate, such as 0.5–5 cm/sec, or slower or faster if desired. The workpiece may be substantially stationary, or may be rotating at a selected angular velocity, as the second processing liquid is transferred to the workpiece.

The second processing liquid has a very low surface tension, much lower than water and most other liquids, and has a higher liquid density than water so that, as the exposed surface area of the workpiece increases, foreign substances are removed from the exposed surface(s) and water and other liquids with higher surface tension are displaced by the second liquid. One result of this procedure is that the workpiece surface can be cleaned and simultaneously dried, often within a time interval of length about 1–60 sec, or longer, if desired.

BRIEF DESCRIPTION OF THE DRAWINGS

FIG. 1 illustrates use of the invention in one embodiment.

FIGS. 2A–2D illustrate possible chemical configurations for HFE.

FIG. 3 is a flow chart illustrating a drying procedure according to the invention.

FIGS. 4A–4F illustrate a suitable procedure for drying workpieces.

FIG. 5 is a side view of a suitable dispenser for HFE or eth-HFE, liquid, to be used with the process shown in FIGS. 4A–4F.

FIG. 6 illustrates one apparatus for transferring HFE or eth-HFE liquid to a workpiece.

FIG. 7 illustrates layers of four-zone drying according to the invention.

FIGS. 8A–8C illustrate another process for practicing the invention.

FIGS. 9, 12, 13, 14, 15 and 16 illustrate alternative apparatus for dispensing the HFE or eth-HFE liquid onto a workpiece that is moved vertically or horizontally.

FIG. 10 is a graph schematically illustrating improvement of drying with increased pressure head used to spray or transfer HFE or eth-HFE liquid.

FIG. 11 is a graph schematically illustrating variation of minimum aperture width $\Delta w0$ with surface tension of a spraying liquid.

FIGS. 17A–17E illustrate other approaches for transferring the HFE or eth-HFE liquid to a workpiece.

DESCRIPTION OF BEST MODES OF THE INVENTION

In FIG. 1, a chemical bath housing or container 11 contains a selected first processing liquid 13 that is prepared at a selected bath temperature in a range T(bath)=10–90° C., optionally using a container heater 15. The (first) processing liquid 13 may be DI water or some other suitable liquid. The first liquid 13 is preferably inert and preferably has a relatively high surface tension. DI water, with a surface tension (room temperature) of about 80 dynes/cm, works well here. IPA, with a relatively low surface tension of 17.6 dynes/cm, also works well here. One or more workpieces 17A, 17B, 17C is fully immersed or submerged in the liquid 13 for a selected time interval of length in the range Δt=1–600 seconds. Alternatively, the workpiece(s) need not be immersed in the first processing liquid. The first liquid 13 is optionally subjected to ultrasonic vibrations generated by one or more ultrasonic transducers 19A, 19B located at an outside wall or at an inside wall or on a bottom wall of the housing 11, or that is located within the first liquid 13 itself. The ultrasonic vibration frequency or frequencies is preferably in the range between 20 kHz and 750 kHz but may be higher if desired. An ultrasonic transducer available from Ney Ultrasonics is capable of generating a sequence of ultrasonic frequencies, including 40, 72, 104 and 136 kHz. Other ultrasonic transducers can generate higher ultrasonic frequencies, and some devices can also generate ultrasonic frequencies as low as 20 kHz.

A workpiece 17A, 17B, 17C is upwardly withdrawn from the first processing liquid 13, and an exposed surface of the workpiece is sprayed with a sheet of a second processing liquid (not explicitly shown in FIG. 1) to achieve rapid workpiece drying and/or cleaning. The second liquid preferably includes a hydrofluoroether (methyl nonafluorobutyl ether or methoxy nonaflurobutane, referred to here as HFE for ease of reference), or an ethylated hydrofluoroether (eth-HFE), available from 3M Company as HFE-7100 or HFE-7200, or as a mixture of a hydrofluoroether or ethylated hydrofluoroether and one or more other chemicals, such as trans-1,2-dichloroethylene, H$_2$ClC—CClH$_2$ (producing an HFE azeotrope) or another halogen-containing alkene. The hydrofluoroether has a chemical composition that is either

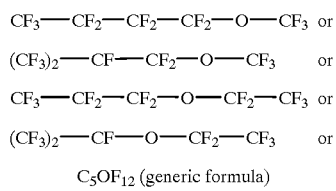

C$_5$OF$_{12}$ (generic formula)

or a mixture of these compositions. The first four of these compositions; are illustrated in FIGS. 2A–2D, respectively, and the first two of these four compositions together appear to provide close to 100 percent of the fractions. The freezing point and boiling point of HFE are approximately T=–135° C. and T=60° C., respectively. HFE has density and surface tension of 1.52 gm/cm$^3$ and 13.6 dynes/cm, respectively. Other HFE formulations have boiling points ranging from 38° C. up to about 80° C. By contrast, isopropyl alcohol (IPA) and water have surface tensions of about 17.6 dynes/cm and 80 dynes/cm, respectively. Thus, HFE can displace IPA, water and most other liquid substances with moderate to high surface tensions from the surface of a workpiece, as the workpiece is withdrawn from a bath or spray of the second liquid. The second liquid may be provided as a conventional liquid or as a vapor, mist, "fog" or other suitable fluid form (collectively referred to here a second "liquid"), although the conventional liquid form is preferred. The eth-HFE has a chemical composition that is either

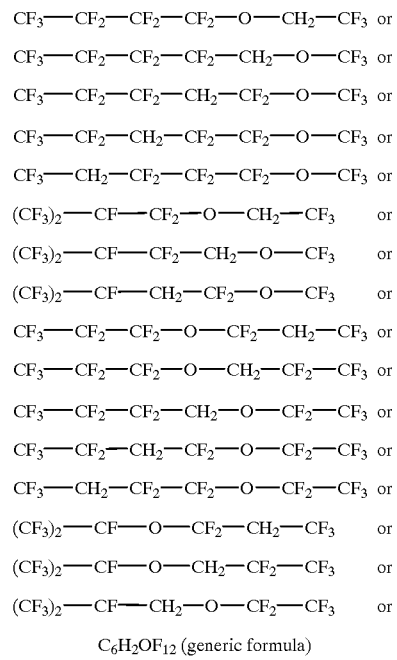

C$_6$H$_2$OF$_{12}$ (generic formula)

or a mixture of these compositions. The first four of these compositions are illustrated in FIGS. 1A–1D, respectively, and the first and sixth of these sixteen compositions together appear to provide close to 100 percent of the fractions.

The linear rate of drawing the workpiece through or from the second liquid is preferably in the range 0.5–10 cm/sec, but may be somewhat faster or slower, and the second liquid is optionally subjected to ultrasonic vibrations while the workpiece is immersed. The molecular weight of HFE and of eth-HFE are about 364 and 378, respectively, which are much higher than the molecular weight of water (18, with 364/18=20.2>>1) or of IPA (60), so that, as the workpiece is drawn through the second liquid, the higher density and lower surface tension of the second liquid cause this liquid (1) to easily displace any liquid droplets with higher surface tension parameters from the workpiece surface(s) and (2) to move down the (partly) exposed surface(s) of the workpiece into the first liquid-second liquid mix below. The workpiece surface(s) is dry within 30 sec after the workpiece is removed from the second liquid, if ultrasonic vibrations are used, and within a somewhat longer time, such as 30–45 sec, after the workpiece is removed from the second liquid, if no ultrasonic vibrations are used. The workpiece is also cleaned by removal of residues from the exposed surface(s), using this approach.

When the second liquid (including HFE or eth-HFE) is held at a temperature of T=10–80° C., at most a few milliliters/minute of this liquid are lost due to volatilization, for a tank with a normal exposed liquid surface. The second liquid can be drawn from the container 11, passed through a filter 21 and returned to its container, to remove the residues and to recycle the second liquid for reuse in drying and/or cleaning.

FIG. 3 is a flow chart illustrating one embodiment of a suitable procedure for practicing the invention. In step 31, a workpiece (electronic part or parts) is fully immersed in a (preferably inert) first processing liquid, such as deionized (DI) water or IPA that is prepared in a selected temperature in the range T=10–90° C., for an immersion time interval (optional) of selected length in the range Δt=0–600 seconds.

In step 33, the first liquid is optionally subjected to ultrasonic wave motion at one or more selected ultrasonic frequencies in the range 20–750 kHz for most or all of the immersion time interval. In step 35, after the time interval of immersion is completed, the workpiece is slowly withdrawn from the bath of the first processing liquid, preferably at a linear rate of withdrawal of between 0.5 and 5 cm/sec and preferably in a clean room or inert environment. In step 37, a selected second processing liquid, such as HFE or eth-HFE, is transferred to the workpiece exposed surface(s) and removed. In step 39 (optional), the selected liquid is filtered or otherwise cleaned and returned to the container or to another container for reuse in another chemical bath. The procedure shown in FIG. 2 will provide some cleaning of the workpiece and will usually dry the workpiece in no more than 1–30 seconds after exposure to the HFE or eth-HFE (1–60 sec for the full process). If only workpiece drying is desired, step 33 can be omitted.

Transfer of the second liquid in step 37 may proceed by spraying the second liquid onto the exposed surface(s) of the workpiece, for example, as a line or strip of sprayed liquid, or by dribbling the liquid onto one or more of the exposed surfaces by a source of the liquid that is positioned above, at the side of or adjacent to the workpiece.

FIGS. 4A–4F illustrate a suitable process for using HFE or eth-HFE and recycling most or all of this liquid in electronic parts wafer drying and cleaning. In FIGS. 4A and 4B, one or (preferably) many workpieces 41, such as semiconductor wafers, printed circuit boards or the like are picked up by one or more workpiece arms 43A and 43B, and the workpieces are positioned in a first housing or tank 45 that is open at the top and that has a drain aperture 47 at the bottom thereof. Preferably, the housing initially contains deionized (DI) water 49, preferably at a temperature in the range 10–90° C., and the workpiece 41 is completely immersed in the DI water.

Preferably, the DI water is filled to the top of, and slightly overflowing from, the first housing 45, in order to minimize accumulation of unwanted material in the DI water through removal by spillover. Alternatively, the workpiece arm(s) 43A and 43B may be replaced by one or more vacuum chucks (preferred) or magnetic or adhesive disks that temporarily grasp and hold the workpiece 41.

In FIG. 4C, a second housing or tank 51 containing a second liquid 50 (e.g., HFE or eth-HFE or azeotrope thereof), preferably maintained at a pressure p of between 10 and 100 psi relative to the environment and maintained at a temperature in the range 10–60° C., is positioned above, at the side of or adjacent to the first housing 41.

The second housing 51 is connected to one, two or more thin plates 53 with slotted apertures or other suitable apertures 55 therein (shown in side view in FIG. 5). The apertures 55 are oriented so that, when the pressurized second liquid 50 is allowed to flow from the second housing 51, the second liquid is sprayed (with or without atomization) from these apertures, in an approximately horizontal, vertical or diagonal pattern. Any object that is located in front of the apertures 55 will be sprayed or otherwise covered with a liquid, vapor or mist from the second liquid 50.

Alternatively, the second housing 51 can be positioned above the first housing 41, and the second liquid can be dribbled onto the exposed surfaces of the workpiece as the workpiece emerges from the first liquid bath, taking care that the volume of second liquid delivered to the workpiece exposed surfaces is sufficient to cover these surfaces before the second liquid runs off these surfaces.

HFE liquid has a specific density of about 1.52 gm/cm$^3$, which is much heavier than the specific density of the DI water ($\approx$1.0 gm/cm$^3$), the HFE is a relatively nonpolar molecule (as compared to a highly polar water molecule), and the HFE surface tension, 13.6 dynes/cm, is much less than that of water ($\approx$80 dynes/cm). Ethylated HFE may have a slightly higher specific density. As a result of these differences, if HFE or eth-HFE is used as the second, liquid 50 in FIG. 3C, most of the HFE or eth-HFE that falls into the first liquid 49 will ultimately sink to the bottom of the (mixed) liquid in the first housing 45. The portion of the HFE or eth-HFE liquid that passes along the exposed surfaces of the workpiece 41 above the first liquid bath can clean and/or dry the workpiece exposed surfaces.

In FIGS. 4D and 4E, the workpieces 31 are now pushed upward within the first liquid by one or more "pusher" arms 53. When approximately half of the workpiece 41 is above the upper surface of the first liquid, the workpiece is gripped by the workpiece arm(s) 43A and 43B (or vacuum chuck or magnetic or adhesive disks) and is pulled slowly upward from the first liquid 49 in the first housing 45, at a preferred linear rate in the range 0.5–10 cm/sec. As the workpiece 41 moves upward, it passes through a region where the workpiece is subjected to the transfer (by spraying, dribbling or other suitable transfer process) of the second liquid 50 thereto from the slotted apertures 55. Because the surface tension of the second liquid, such as HFE or eth-HFE, is much smaller than the surface tension of the first liquid (e.g., DI water or IPA), the second liquid will displace the first liquid from the surface of the workpiece 41. HFE (or eth-HFE) and similar second liquids are also fairly volatile, with a relatively low heat of vaporization (around 30 cal/gm for HFE and for eth-HFE) and high vapor pressure (about 195 mm Hg) so that any portion of the second liquid that displaces the first liquid on the workpiece surfaces will ultimately evaporate and will thereby quickly dry a contiguous portion of an exposed surface of the workpiece 41. In FIG. 4F, the workpiece 41 has been pulled completely from the first liquid in the first housing 45.

Most or all of the second liquid (BFE or eth-HFE) that does not evaporate from the exposed surfaces of the workpiece 41 will fall into the first liquid and will sink to and collect at the bottom of the first housing, where this (primarily second) liquid can be removed, using the bottom aperture of the first housing, for recycling of the second liquid. If the atmosphere in which the apparatus shown in FIGS. 4A–4F is maintained dry and inert, for example, by use of cool dry $N_2$ or CO, the portion of the second that evaporates from the workpiece surfaces can also be recovered, recycled and reused. Reuse may be possible even where the atmosphere is not dry and inert.

FIG. 6 indicates a suitable arrangement of apparatus for use of the second liquid to dry and clean electronic parts. Two hollow cylinders 61A and 61B are positioned with their longitudinal axes approximately parallel. Each of the cylinders 61A and 61B has one or more longitudinally oriented slotted apertures 63A and 63B, respectively, therein, with a slot width h that is preferably in the range 0.02–0.5 mm. Each cylinder 61A and 61B is connected to a source 65 of pressurized HFE or eth-HFE or other suitable second liquid. If this pressure is sufficiently high, the second liquid is forced through the slotted apertures and emerges as a thin sheet or spray 67, in the shape of a sheet or a sector of a cylinder, and these sprays collide with and cover a workpiece 69 that is positioned between the two slotted apertures 63A and 63B. The HFE or eth-HFE or other suitable second liquid can be heated modestly (e.g., to T$\approx$30–50° C.) as it emerges from the slotted apertures 63A and 63B so that, when the second liquid collides with the surfaces of the workpiece 69, the second liquid will more quickly evaporate and thereby dry the workpiece. If the spray velocity is made large enough, the HFE or eth-HFE spray can also remove unwanted residues from portions of the exposed surfaces of, and thereby clean, the workpiece 69. The hollow cylinders 61A and 61B are preferably rotated in the same direction or in opposite directions around their respective longitudinal axes at an angular velocity $\omega$ in the range $2\pi$–$100\pi$ radians per second, using a mechanical rotator 71.

Cleaning a workpiece surface(s) with HFE or eth-HFE or HFE azeotrope liquids according to the preceding procedure appears to remove most or all the contaminant particles with sizes greater than about 0.1 $\mu$m, as is presently required for a surface cleaning process for semiconductor, optical and electronic surfaces. In tests according to the preceding procedure, the workpiece surfaces were observed to become dry shortly after the workpieces were removed from the first liquid so that workpiece surface drying and cleaning occurred approximately simultaneously.

According to product specifications provided by the developer of HFE, 3M company, each of HFE and eth-HFE is intended to be a non-toxic replacement for the CFCs and similar chemicals used in various applications over the past 30 years. HFE is substantially non-toxic with an acute lethal inhalation concentration that exceeds 100,000 parts per million. HFE is not presently classified as a hazardous substance. However, a mixture of HFE and another chemical may be more active. The HFE azeotrope, for example, is volatile, and disposal of HFE azeotrope into a water supply may require compliance with hazardous waste regulations. No corresponding figures have yet been released for eth-HFE.

DI water and either HFE or eth-HFE readily form a liquid/liquid two-component system with little mixing (20 ppm of HFE in DI water; 90 ppm of DI water in HFE, for example), due in part to the high polarity of water and the relatively lower polarity of the HFE or eth-HFE and the differences in molecular weight. The HFE or eth-HFE is thus easily separated from the DI water, or any other inert, lighter, higher polarity liquid, such as IPA, for filtering and reuse or for disposal of the HFE or eth-HFE.

The process of the invention has three or four zones of drying, as illustrated on a surface of a workpiece 81 shown in FIG. 7. As the workpiece is withdrawn from the first liquid, the bottom zone 81A is still immersed in the first liquid. A second zone 81B, adjacent to the bottom zone 81A, has risen above the first liquid but has particles of air and/or processing liquid on the surface. A third zone 81C, adjacent to the second zone 81B, has the second liquid transferred thereto by spraying or dribbling, and the second liquid forms a fluid sheet (liquid and/or atomized gas particles) of the second liquid, mixing with and displacing the air and/or processing liquid particles that remain on the exposed surface. In a fourth zone 81D, adjacent to the third zone 81C, the fluid sheet of second liquid has volatilized, usually in 30 sec or less, leaving a dry workpiece surface in this zone. The second zone 81B can be eliminated, if desired, by forming the second liquid fluid sheet in a region slightly above the exposed surface of the processing liquid in the tank.

Another procedure for practicing the invention is illustrated in FIGS. 8A–8C. In FIG. 8A, a workpiece 91, which has recently been removed from a first processing liquid (e.g., DI water or IPA, not shown), is immersed in a tank 93 containing a second processing liquid 95, such as HFE or eth-HFE or HFE azeotrope, which is heated to a temperature below its boiling point (T≈60–80° C. for HFE). The workpiece 91 is immersed in the second liquid 95 for a selected immersion time interval, preferably in the range 5–120 sec, or longer if desired. For at least a portion of the immersion time interval (e.g., at least 5–10 sec), the workpiece 91 is subjected to ultrasonic vibrations generated by an ultrasonic wave generator 97 that is positioned inside, or outside and contiguous to, the tank 93. The ultrasonic vibrations help the low surface tension second liquid 95 displace material residues, air and first liquid on exposed surfaces of the workpiece 91. After the immersion time interval ends, the workpiece 91 is withdrawn from the second liquid 95, as shown in FIG. 8B, at a linear withdrawal rate in a preferred range of 0.5–10 cm/sec, into a controlled atmosphere, such as a vacuum, a clean room or an atmosphere containing primarily $N_2$ or CO. Any of the second liquid remaining on the exposed surface(s) of the workpiece 91 after the workpiece is fully withdrawn (FIG. 8C) will usually volatilize within 1–30 sec after the workpiece is withdrawn from the second liquid 95.

As illustrated in FIG. 9, a workpiece 101 can be withdrawn vertically (in the direction of the vector v) between two plenums 103A and 103B, with longitudinally oriented apertures, 104A1, 104A2, 104B1 and 104B2, that spray HFE or eth-HFE liquid onto one side or two opposed sides of the workpiece at a selected incidence angle $\phi$ relative to the workpiece surface. The HFE or eth-HFE liquid 105 is held in a fluid reservoir 107 that is connected to the apertures through a pressurized pump 109 or other suitable device, which delivers the HFE or eth-HFE liquid to the apertures 103A and 103B with a controllable pressure head $\Delta p$. Unvolatilized spray liquid and any other processing liquid (e.g., water) and other residues removed from the workpiece surface are collected in a collector 110, located below the workpiece 101, for possible cleaning and recycling or for disposal.

Alternatively, the workpiece 101 can be oriented at an angle $\alpha$ relative to the vertical (indicated as a workpiece 101' in FIG. 9), where $\alpha$ ranges from a few degrees to about 80°, with all other aspects remaining the same.

We have found that, with an aperture width or gap $\Delta w$ of the order of 0.05 mm, a pressure head value $\Delta p$ of the order of 40 psi for HFE or eth-HFE is sufficient to dry a workpiece surface that is exposed to the HFE or eth-HFE spray in as little as 5–7 sec. We estimate that the aperture width $\Delta w$ could be reduced to as low as 0.02 mm and the HFE or eth-HFE liquid would still form an acceptable, continuous spray after passing through the apertures 103A and 103B, because of the low surface tension and other features associated with the HFE or eth-HFE liquid. If the HFE or eth-HFE liquid were replaced by another liquid with a higher surface tension, such as IPA or DI water, we estimate that the aperture width $\Delta w$ could not be reduced below about 0.05 mm, if a continuous spray is to be maintained at a modest pressure head of the order of 40 psi.

Where HFE or eth-HFE liquid, maintained at an elevated temperature such as 40° C., is used with this configuration, we find that we can withdraw a 200 mm diameter semiconductor wafer from the liquid in 5–7 sec (linear withdrawal rate of about 29 mm/sec). At the end of this second withdrawal period, we find that most of the wafer is fully dry, based on "bare eye" examination, and within a few seconds after removal of the last of the wafer from the HFE liquid, the wafer is fully dry. We believe that, if the HFE or eth-HFE liquid temperature is raised to a higher temperature, such as 50–56° C., the wafer can be withdrawn in a shorter time interval, such as 3–5 sec, and the wafer will be fully dry as soon as the wafer has cleared the liquid. The relatively high vapor pressure of the HFE or eth-HFE liquid at room temperature (210 mm Hg) ensures that any HFE or eth-HFE liquid that remains but cannot be seen with a "bare eye" examination after removal of the wafer will be very quickly volatilized.

Several parameters are available to optimize the drying and the cleaning characteristics of the HFE, applied in the configuration shown in FIG. 9. First is the temperature, already discussed in the preceding. As the HFE liquid temperature is raised, the drying process and, separately, the cleaning process appear to occur more quickly. A second optimizing parameter is the angle φ at which the spray (one-sided or two-sided) is directed at and strikes the workpiece 101. We believe that an angle φ somewhere between grazing incidence (φ≈0°) and near-normal incidence (φ≈90°) is optimal here.

A third optimizing parameter is the pressure head Δp imposed on the HFE liquid behind the aperture(s). Workpiece drying and/or cleaning appears to improve as the pressure head Δp is increased, but the improvement appears to be saturating, as suggested in the schematic graph of a selected drying characteristic τ (time to dry) versus Δp shown in FIG. 10.

A fourth optimizing parameter is the aperture width Δw. As Δw is decreased, the amount of HFE or eth-HFE liquid directed at the workpiece surface will decrease, if the pressure head Δp is held constant, no matter what liquid is used. When the aperture width Δw decreases below what is believed to be a threshold or minimum value, Δw0, which depends upon liquid temperature, liquid surface tension, pressure head and possibly other variables, the continuous spraying action will give way to erratic and uncontrollable spurts of the liquid. The threshold aperture width Δw0 at which this transition occurs will decrease approximately monotonically with decreasing surface tension, as suggested by the schematic graph of Δw0 versus liquid surface tension in FIG. 11. Thus, the threshold aperture, width Δw0 for HFE liquid should be lower than Δw0 for IPA, which should be lower than Δw0 for DI water. Thus, HFE or eth-HFE liquid has a greater range of relevant operating parameters, such as Δp and Δw, for drying and/or cleaning than does a liquid such as IPA or DI water.

A fifth optimizing parameter is the rate r of linear withdrawal of the workpiece through the liquid spray. Here, a given drying and/or cleaning characteristic will continue to improve as the withdrawal rate r is decreased, but this must be balanced by consideration of the desired drying and/or cleaning time for the workpiece, which time will be approximately proportional to 1/r as the rate r is decreased.

A sixth optimizing parameter is the number N of apertures used to spray HFE or eth-HFE liquid onto the workpiece on one side. In FIG. 8, N=2 sprays are provided for each side. One can choose N=1, 2, 3 or any other reasonable number, and the drying and/or cleaning characteristic should improve with increasing N, if the sprays on a given side are kept far enough apart that they do not interfere with each other. If two adjacent sprays are located close enough to interfere with each other, this may increase the effective workpiece drying time, although the cleaning characteristic may be improved or degraded, depending on the workpiece and the circumstances.

As illustrated in FIG. 12, a sequence of workpieces 111-1, 111-2, 111-3 can be drawn more or less vertically (in the direction of the path vectors v) in a curvilinear path P between two plenums 113A and 113B, with longitudinally oriented apertures, 114A1, 114A2, 114B1 and 114B2, that spray HFE or eth-HFE liquid onto one side or two opposed sides of the workpiece at a selected incidence angle φ relative to the workpiece surface. The HFE or eth-HFE liquid 115 is held in a fluid reservoir 117 that is connected to the apertures through a pressurized pump 119 or other suitable device, which delivers the HFE liquid to the apertures 113A and 113B with a controllable pressure head Δp.

As illustrated in FIG. 13, a workpiece 121 can be drawn horizontally (in the direction of the vector v) between two plenums 123A and 123B, each having one or more vertically oriented apertures, 124A and 124B, that spray HFE or eth-HFE liquid onto one side or two opposed sides of the workpiece at a selected incidence angle relative to the workpiece surface. The HFE or eth-HFE liquid 125 is held in a fluid reservoir 127 that is connected to the apertures through a pressurized pump 129 or other suitable device, which delivers the HFE or eth-HFE liquid to the apertures 124A and 124B with a controllable pressure head Δp. Unvolatilized spray liquid and any other processing liquid (e.g., water) and other residues removed from the workpiece surface are collected in a collector 130, located below the workpiece 121, for possible cleaning and recycling or for disposal.

The choices of pressure head Δp, aperture width Δw, liquid temperature T, linear rate r of horizontal movement of the workpiece and the other parameters are substantially as in FIGS. 9 or 12. One advantage of the configuration in FIGS. 12 or 13, vis-a-vis the vertical configuration in FIG. 9, is that two or more workpieces 121 can be moved through the spray serially so that the drying and/or cleaning process (es) can be operated as a single workpiece continuous process, in which the workpieces move through a region where spraying occurs serially. One possible disadvantage of the horizontal processing shown in FIG. 13 is that the sprayed HFE or eth-HFE liquid that does not immediately volatilize upon striking the workpiece may vertically run down the workpiece and interact with or interfere with another portion of the HFE or eth-HFE liquid being sprayed on an adjacent portion of the workpiece at about the same time.

This possible disadvantage is minimized, if not eliminated, by the horizontal movement/diagonal spray configuration illustrated in FIG. 14. In this configuration, the workpiece 131 is drawn horizontally at a linear rate r (in the direction of the vector v) between a first diagonally oriented apertures 134A and a second diagonally oriented aperture (not shown) that spray HFE or eth-HFE liquid onto one side or two opposed sides of the workpiece. The liquid spray on each side of the workpiece contacts the workpiece along a diagonal line having an associated diagonal angle θ as shown. The HFE or eth-HFE liquid 135 is held in a fluid reservoir 137 that is connected to the apertures through a pressurized pump 139 or other suitable device, which delivers the HFE or eth-HFE liquid to a first plenum 133A and to a second plenum (not shown) having the respective first and second apertures, with a controllable pressure head Δp through apertures having aperture widths Δw. Unvolatilized spray liquid and any other processing liquid (e.g., water) and other residues removed from the workpiece surface are collected in a collector 140, located below the workpiece 131, for possible cleaning and recycling or for disposal. The choices of pressure head Δp, aperture width Δw, liquid temperature T, linear rate r of horizontal movement of the workpiece and the other parameters are substantially as in FIGS. 9, 12 or 13. The configuration of FIG. 14 allows single workpiece processing and batch processing, as in FIG. 13, but the unvolatilized HFE or eth-HFE liquid at one portion of the sprayed workpiece does not substantially interfere with spraying of HFE or eth-HFE liquid onto an adjacent portion of the workpiece.

The configuration of FIG. 14 has a seventh optimizing parameter, the diagonal angle θ for application of the sprayed liquid. An optimum diagonal angle θ(opt) will likely depend upon the linear rate r at which the workpiece is drawn horizontally through the spray and upon a representative rate s(vert) at which unvolatilized HFE or eth-HFE liquid can vertically run down a surface of the workpiece 131: as s(vert) increases, a minimum diagonal angle θ, at which this process can be operated without liquid—liquid interference, will likely increase.

FIG. 15 illustrates another alternative configuration for drying and/or cleaning a workpiece 141. The workpiece 141 is transported through a processing region 142 where one or more approximately circular moving current(s) (spray or bulk liquid) C1, C2 of the second liquid move across each surface of the workpiece to be processed. A nominal center c1, c2 of each of the approximately circular moving currents C1, C2 is preferably located away from the workpiece surface so that each point on the workpiece surface experiences a current C1, C2 with a non-zero liquid velocity. Alternatively, the nominal center c1, c2 for the current C1, C2 can be located on an exposed surface of the workpiece 141.

Each circularly moving current C1, C2 is provided by a circulation mechanism 143, partly or fully immersed in the second liquid, such as a mechanically-driven or magnetically-driven liquid stirrer. The liquid angular velocity ω associated with each approximately circular flow pattern C1, C2 may be chosen in the range from a fraction of a radian per sec (e.g., 0.2 rad/sec) up to several hundred radians per sec (e.g., 500 rad/sec). The second liquid 144 is preferably held in a fluid reservoir 145 and is delivered by a pump 146 at selected time intervals to the workpiece processing region 142, where the circulation mechanism 143 causes the second liquid to move in an approximately circular pattern.

The workpiece 141 is moved through the processing region 142 by one or more mechanical arms 147A and 147B (or a vacuum chuck or magnetic or adhesive disk workpiece gripper) and is subjected to the circularly moving current C1, C2 of the second liquid. Alternatively, the workpiece 141 can be held stationary and the circularly moving current(s) C1, C2 can be caused to sweep across the workpiece surface(s) to be processed. After the workpiece surface(s) has been processed by the second liquid, the second liquid used for this purpose is optionally drained into or otherwise deposited in a spent liquid plenum 148 and is either dumped or (preferably) cycled through a liquid filtering mechanism 149 and redeposited in the fluid reservoir 145.

Where the workpiece 141 is subjected to only one circularly moving current, C1 or C2, of the second liquid, the nominal radius, r1 or r2, of this current pattern is preferably greater than the diameter of the workpiece surface(s) to be processed. Where the workpiece 141 is subjected to two or more circularly moving currents, C1 or C2, the nominal radius, r1 and/or r2, of one or both of these current patterns is optionally chosen to be somewhat greater than one-half of the diameter of the workpiece, and the two currents, C1 or C2, cooperate to move across and fully cover the workpiece surface(s) to be processed, as illustrated in FIG. 14. The nominal centers, c1 and c2, of the currents, C1 and C2, are then located so that the workpiece surface(s) to be processed moves between these nominal centers.

Two or more workpieces 151 and 152 may be positioned close to and adjacent to each other, as illustrated in apparatus shown in FIG. 16, and three pressure heads 153A, 153B and 153C may be positioned adjacent to these workpieces, as shown, in order to clean and dry the workpiece exposed surfaces. Each of the outer pressure heads 153A and 153C has one or more spray apertures, 154A and 154C, respectively, to provide drying and/or cleaning of one exposed surface of the adjacent workpiece. The middle or inner pressure head 153B has one or more spray apertures 154B1 and 154B2 located on each side thereof to spray an exposed surface of the adjacent workpiece, 151 and 152, respectively. The apparatus 150 also includes a reservoir or supply tank 157 of second liquid 155 and a pressure pump 159 that delivers pressurized second liquid to the pressure heads 153A, 153B and 153C. A liquid collector 160, located below the workpieces 151 and 152 in the spraying region, collects liquid that drips off the workpieces for possible recycling and reuse.

Proceeding in the manner illustrated in FIG. 16, two or more workpieces, located adjacent to each other, can be simultaneously dried and/or cleaned, as might occur in a true batch process. A separation distance, D1 and/or D2, between two adjacent workpieces, 151 and 152, that is at least equal to a selected minimum separation distance D(min) should be maintained in order to provide sufficient clearance distance, D(clear;1) and D(clear;2), for a pressure head 153B and associated spray apertures, 154B1 and 154B2, to pass between the adjacent workpieces, 151 and 152. These clearance distances preferably include an adequate backoff distance of each spray aperture, 154B1 and 154B2, from the corresponding exposed surface of an adjacent workpiece.

The spray patterns defined by the spray apertures 154A, 154B1, 154B2 and 154C may be horizontally oriented, vertically oriented or diagonally oriented, as illustrated in FIGS. 9, 13 and 14, and may be independently chosen for each spray pattern. For example, because of the different nature of the two exposed surfaces of the workpiece 151, the spray patterns formed by the apertures 154A and 154B1 might be vertical and diagonal, respectively. The spray patterns defined on each of the two exposed surfaces for the workpieces in FIGS. 6, 9, 12, 13, 14, 15 and 16 may be independently chosen. Optionally, only one exposed surface or side of the workpieces in FIGS. 6, 9, 12, 13, 14, 15 and 16 may be dried and/or cleaned, if desired.

FIGS. 17A–17E illustrate other approaches to transferring the HFE or eth-HFE liquid to a workpiece. In FIG. 17A, an exposed surface of the workpiece 161 is spinning at a selected angular frequency ω about a selected rotation axis that passes through the exposed surface, and one or more sheets 163-n (n=1, 2, 3, ... ) of HFE-based liquid (e.g., HFE or eth-HFE liquid), shown schematically as lines on the surface, are sprayed onto the workpiece surface as the surface rotates. Each of the sheets 163-n may have the same HFE-based liquid. Alternatively, two or more of the sheets 163-n may use different HFE-based liquids as the spray material, in order to take advantage of different responses of contaminants on the workpiece surface(s) to different HFE-based liquids.

Two or more of the sheets 165-n of HFE-based liquid in FIG. 17A need not be parallel to each other and may be planar sheets (165-1) or curvilinear sheets (165-2, 165-3) or a mixture of planar sheets and curvilinear sheets; and if these sheets are not parallel to each other, as illustrated in FIG. 17B, the sheets need not intersect each other at or near the center of rotation of the workpiece 161.

In FIG. 17C, two or more sheets 167-1 and 167-2 of different HFE-based liquids are sprayed onto a surface of a rotating workpiece 161 along different line segments that preferably each cover the entire workpiece surface as the workpiece surface rotates at a selected angular velocity ω about a selected rotation axis that passes through the exposed surface. As in FIG. 17A, the two sheets 167-1 and 167-2 may have the same HFE-based liquid as a spray. Alternatively, the two sheets 167-1 and 167-2 may each have a different HFE-based liquid, in order to take advantage of different responses of contaminants on the workpiece surface(s) to different HFE-based liquids.

In FIG. 17D, one or more liquid streams 169 of HFE-based liquid is deposited onto a selected location on a surface of a rotating workpiece 161 as the workpiece surface rotates at a selected angular velocity ω about a selected rotation axis that passes through the exposed surface, and the HFE-based liquid is allowed to spread across part or all of the workpiece surface by action of rotation (centrifugal force, etc.) of the workpiece surface.

In FIG. 17E, an exposed surface (not shown) of the workpiece 161 that is to be cleaned is placed in contact with an exposed surface of, or immersed in, a pool of HFE-based liquid 171. The exposed surface is rotated at a selected angular velocity ω about a selected rotation axis that passes through the exposed surface. A combination of (1) exposure of the exposed surface to the HFE-based liquid and (2) a shear force developed between, the rotating exposed surface and the contiguous HFE-based liquid 171. The shear force may become reduced by the tendency of the HFE-based liquid 171 to "spin up" to the rotational velocity of the exposed surface. The shear force magnitude may be kept high by moving the workpiece exposed surface around within the pool of HFE-based liquid so that the presently contiguous liquid does not have time to fully "spin up" to the angular velocity of the rotating exposed surface.

What is claimed is:

1. A method for drying a workpiece that has been immersed in a first processing liquid, the method comprising the steps of:

after the workpiece has been withdrawn from the first liquid, transferring to least one exposed surface of the workpiece a second processing liquid, where the second liquid has a surface tension that is less than 17 dynes/cm, and has a second liquid density that is much greater than density of the first liquid;

whereby at least one exposed surface of the workpiece dries in a drying time interval whose length lies in a range of 1–60 seconds.

2. The method of claim 1, further comprising the step of choosing said second liquid from the class consisting of hydrofluoroether, an azeotrope of hydrofluoroether, an ethylated hydrofluoroether and an azeotrope of an ethylated hydrofluoroether, maintained at a selected temperature in the range 10–80° C.

3. The method of claim 1, wherein said step of transferring said drying liquid to said exposed surface of said workpiece comprises spraying said second liquid onto a selected portion of said exposed surface of said workpiece.

4. The method of claim 3, wherein said step of transferring said second liquid to said at least one exposed surface of said workpiece comprises the steps of:

directing a sheet of said second liquid in a selected direction toward said at least one exposed surface of said workpiece so that a selected region, having a selected orientation relative to a vertical direction, of said at least one exposed surface is wetted by the sheet of said second liquid; and moving at least one of said workpiece and the sheet of said second liquid so that substantially all regions of said at least one exposed surface of said workpiece are wetted by the sheet of said second liquid.

5. The method of claim 4, further comprising the step of choosing said selected orientation of said selected region from a class of orientations consisting of vertical orientation, horizontal orientation and diagonal orientation.

6. The method of claim 4, further comprising the steps of:

directing a second sheet of said second liquid in a selected direction toward said a second exposed surface of said workpiece so that a second selected region, having a second selected orientation relative to a vertical direction, of the second exposed surface is wetted by the second sheet of said second liquid; and moving at least one of said workpiece and the second sheet of said second liquid so that substantially all regions of the second exposed surface of said workpiece are wetted by the second sheet of said second liquid.

7. The method of claim 6, further comprising the steps of:

choosing said first selected orientation of said selected region from a first class of orientations consisting of vertical orientation, horizontal orientation and diagonal orientation; and choosing said second selected orientation of said second selected region from a second class of orientations consisting of vertical orientation, horizontal orientation and diagonal orientation.

8. The method of claim 4, further comprising the step of rotating said selected direction of said sheet of said second liquid relative to said workpiece so that substantially all regions of said at least one exposed surface of said workpiece are wetted by said sheet of said second liquid.

9. The method of claim 1, wherein said step of transferring said second liquid to said exposed surface of said workpiece comprises dribbling said second liquid onto a selected region of said exposed surface of said workpiece.

10. The method of claim 1, wherein said step of transferring said second liquid to said exposed surface of said workpiece comprises:

rotating said exposed surface at a selected angular velocity about a selected rotation axis that passes through said exposed surface; and spraying said second liquid in a sheet onto a selected portion of said exposed surface as said exposed surface rotates.

11. The method of claim 1, wherein said step of transferring said second liquid to said exposed surface of said workpiece comprises:

rotating said exposed surface at a selected angular velocity about a selected rotation axis that passes through said exposed surface; and spraying said second liquid in at least a first sheet and a second sheet onto a selected portion of said exposed surface as said exposed surface rotates.

12. The method of claim 1, wherein said step of transferring said second liquid to said exposed surface of said workpiece comprises:

rotating said exposed surface at a selected angular velocity about a selected rotation axis that passes through said exposed surface; and directing a stream of said second liquid onto a selected portion of said exposed surface as said exposed surface rotates.

13. The method of claim 1, wherein said step of transferring said second liquid to said exposed surface of said workpiece comprises:

rotating said exposed surface at a selected angular velocity about a selected rotation axis that passes through said exposed surface;

immersing said exposed surface in said second liquid for a selected processing time interval whose length lies in a range of 5–60 seconds; and removing said exposed surface from said second liquid.

14. A method for cleaning a workpiece, the method comprising the steps of:

transferring to least one exposed surface of the workpiece a processing liquid, where the processing liquid has a surface tension that is less than 17 dynes/cm and has a liquid density that is much greater than the density of water;

whereby contaminants on at least one exposed surface of the workpiece are removed from the at least one exposed surface.

15. The method of claim 14, further comprising the step of choosing said processing liquid from the class consisting of hydrofluoroether, an azeotrope of hydrofluoroether, an ethylated hydrofluoroether and an azeotrope of an ethylated hydrofluoroether, maintained at a selected temperature in the range 20–60° C.

16. The method of claim 14, wherein said step of transferring said liquid to said exposed surface of said workpiece comprises spraying said liquid onto a selected portion of said exposed surface of said workpiece.

17. The method of claim 14, wherein said step of transferring said liquid to said at least one exposed surface of said workpiece comprises the steps of:

directing a sheet of said liquid in a selected direction toward said at least one exposed surface of said workpiece so that a selected region, having a selected orientation relative to a vertical direction, of said at least one exposed surface is wetted by the sheet of said liquid; and moving at least one of said workpiece and the sheet of said liquid so that substantially all regions of said at least one exposed surface of said workpiece are wetted by the sheet of said liquid.

18. The method of claim 17, further comprising the step of choosing said selected orientation of said selected region from a class of orientations consisting of vertical orientation, horizontal orientation and diagonal orientation.

19. The method of claim 17, further comprising the steps of:

directing a second sheet of said second liquid in a selected direction toward said a second exposed surface of said workpiece so that a second selected region, having a second selected orientation relative to a vertical direction, of the second exposed surface is wetted by the second sheet of said second liquid; and moving at least one of said workpiece and the second sheet of said second liquid so that substantially all regions of the second exposed surface of said workpiece are wetted by the second sheet of said second liquid.

20. The method of claim 19, further comprising the steps of:

choosing said first selected orientation of said selected region from a first class of orientations consisting of vertical orientation, horizontal orientation and diagonal orientation; and choosing said second selected orientation of said second selected region from a second class of orientations consisting of vertical orientation, horizontal orientation and diagonal orientation.

21. The method of claim 17, further comprising the step of rotating said selected direction of said sheet of said liquid relative to said workpiece so that substantially all regions of said at least one exposed surface of said workpiece are wetted by said sheet of said liquid.

22. The method of claim 14, wherein said step of transferring said processing liquid to said exposed surface of said workpiece comprises:

rotating said exposed surface at a selected angular velocity about a selected rotation axis that passes through said exposed surface; and spraying said processing liquid in a sheet onto a selected portion of said exposed surface as said exposed surface rotates.

23. The method of claim 14, wherein said step of transferring said processing liquid to said exposed surface of said workpiece comprises:

rotating said exposed surface at a selected angular velocity about a selected rotation axis that passes through said exposed surface; and spraying said processing liquid in at least a first sheet and a second sheet onto a selected portion of said exposed surface as said exposed surface rotates.

24. The method of claim 14, wherein said step of transferring said processing liquid to said exposed surface of said workpiece comprises:

rotating said exposed surface at a selected angular velocity about a selected rotation axis that passes through said exposed surface;

spraying said processing liquid in a sheet onto a first selected portion of said exposed surface as said exposed surface rotates; and spraying a second processing liquid in a sheet onto a second selected portion of said exposed surface as said exposed surface rotates, where the second processing liquid has a surface tension that is less than 17 dynes/cm, has a liquid density that is much greater than the density of water and is different from said first processing liquid.

25. The method of claim 14, wherein said step of transferring said processing liquid to said exposed surface of said workpiece comprises:

rotating said exposed surface at a selected angular velocity about a selected rotation axis that passes through said exposed surface; and directing a stream of said processing liquid onto a selected portion of said exposed surface as said exposed surface rotates.

26. The method of claim 14, wherein said step of transferring said second liquid to said exposed surface of said workpiece comprises:

rotating said exposed surface at a selected angular velocity about a selected rotation axis that passes through said exposed surface;

immersing said exposed surface in said second liquid for a selected processing time interval whose length lies in a range of 5–60 seconds; and removing said exposed surface from said second liquid.

27. A method for drying a workpiece, the method comprising the steps of:

immersing the workpiece in a selected processing liquid, where the liquid has a surface tension that is less than 17 dynes/cm, and has a liquid density that is much greater than the density of water;

forming a selected flow pattern of the liquid that is approximately circular across at least a portion of at least one exposed surface of the workpiece, for a selected time interval; and removing the workpiece from the liquid, whereby the at least a portion of the at least one exposed surface of the workpiece dries within 45 seconds after being removed from the liquid.

28. The method of claim 27, further comprising the step of choosing said liquid from the class consisting of hydrofluoroether and an azeotrope of hydrofluoroether, maintained at a selected temperature in the range 20–60° C.

29. The method of claim 27, further comprising the step of choosing said flow pattern to have an approximate center for said approximately circular flow that is spaced apart from said workpiece.

30. The method of claim 27, further comprising the step of choosing said flow pattern to have an approximate center for said approximately circular flow that is located within said at least one portion of said at least one exposed surface of said workpiece.

31. The method of claim 28, further comprising the step of forming said approximately circular flow pattern with an associated liquid angular velocity in the range 0.2–500 radians per second.

32. The method of claim 31, further comprising the step of forming a second selected flow pattern of said liquid that is approximately circular across at least a second portion of said at least one exposed surface of said workpiece, for a second selected time interval, where said first portion and the second portion of said at least one exposed surface of said workpiece overlap each other.

33. A method for cleaning a workpiece, the method comprising the steps of:

immersing the workpiece in a selected processing liquid, where the liquid has a surface tension that is less than 17 dynes/cm, and has a liquid density that is much greater than the density of water;

forming a selected flow pattern of the liquid that is approximately circular across at least a portion of at least one exposed surface of the workpiece, for a selected time interval; and removing the workpiece from the liquid, whereby contaminants are removed from the at least one exposed surface.

34. The method of claim 33, further comprising the step of choosing said liquid from the class consisting of hydrofluoroether and an azeotrope of hydrofluoroether, maintained at a selected temperature in the range 20–60° C.

35. The method of claim 33, further comprising the step of choosing said flow pattern to have an approximate center for said approximately circular flow that is spaced apart from said workpiece.

36. The method of claim 33, further comprising the step of choosing said flow pattern to have an approximate center for said approximately circular flow that is located within said at least one portion of said at least one exposed surface of said workpiece.

37. The method of claim 36, further comprising the step of forming said approximately circular flow pattern with an associated liquid angular velocity in the range 0.2–500 radians per second.

38. The method of claim 33, further comprising the step of forming a second selected flow pattern of said liquid that is approximately circular across at least a second portion of said at least one exposed surface of said workpiece, for a second selected time interval, where said first portion and the second portion of said at least one exposed surface of said workpiece overlap each other.

39. A method for drying a workpiece, the method comprising the steps of:

immersing the workpiece in a selected processing liquid that has a surface tension that is less than 17 dynes/cm and that has a liquid density that is much greater than the density of water, where the liquid is heated to a selected temperature that is less than the boiling temperature of the liquid, for a selected immersion time interval of at least 5 seconds;

subjecting the workpiece to ultrasonic vibrations in a selected frequency range within the liquid for at least a portion of the immersion time interval; and withdrawing the workpiece from the liquid at a selected withdrawal rate, whereby an exposed surface of the workpiece dries after the workpiece surface is withdrawn from the liquid in a drying time interval whose length does not exceed 30 seconds.

40. The method of claim 39, further comprising the step of choosing said liquid from the class consisting of hydrofluoroether and an azeotrope of hydrofluoroether, maintained at a selected temperature in the range 20–60° C.

41. The method of claim 39, further comprising the steps of:

maintaining said liquid at a selected temperature in the range of 30–60° C.; and withdrawing said workpiece from said liquid at a withdrawal rate in the range of 0.5–5 cm/sec.

42. A method for cleaning a workpiece, the method comprising the steps of:

immersing the workpiece in a selected processing liquid that has a surface tension that is less than 17 dynes/cm and that has a liquid density that is much greater than the density of water, where the liquid is heated to a selected temperature that is less than the boiling temperature of the liquid, for a selected immersion time interval of at least 5 seconds;

subjecting the workpiece to ultrasonic vibrations in a selected frequency range within the liquid for at least a portion of the immersion time interval; and withdrawing the workpiece from the liquid at a selected withdrawal rate, whereby contaminants on at least one exposed surface of the workpiece are removed.

43. The method of claim 42, further comprising the step of choosing said liquid from the class consisting of hydrofluoroether and an azeotrope of hydrofluoroether, maintained at a selected temperature in the range 20–60° C.

44. The method of claim 43, further comprising the steps of:

maintaining said liquid at a selected temperature in the range of 30–60° C.; and withdrawing said workpiece from said first liquid at a withdrawal rate in the range of 0.5–5 cm/sec.

* * * * *

(12) EX PARTE REEXAMINATION CERTIFICATE (5682nd)
United States Patent
Ferrell et al.

(10) Number: US 6,119,366 C1
(45) Certificate Issued: *Feb. 27, 2007

(54) CHEMICAL DRYING AND CLEANING METHOD

(75) Inventors: Gary W. Ferrell, Half Moon Bay, CA (US); Robert J. Elson, Palo Alto, CA (US); John F. Schipper, Palo Alto, CA (US)

(73) Assignee: Sez AG, Villach (AT)

Reexamination Request:
No. 90/006,232, Oct. 25, 2001

Reexamination Certificate for:
Patent No.: 6,119,366
Issued: Sep. 19, 2000
Appl. No.: 09/109,460
Filed: Jul. 2, 1998

(*) Notice: This patent is subject to a terminal disclaimer.

Related U.S. Application Data

(63) Continuation of application No. 09/034,369, filed on Mar. 3, 1998, now Pat. No. 5,974,689.

(51) Int. Cl.
*F26B 3/00* (2006.01)

(52) U.S. Cl. .............................. 34/340; 34/342; 34/401
(58) Field of Classification Search ...................... None
See application file for complete search history.

(56) References Cited

U.S. PATENT DOCUMENTS

| | | | |
|---|---|---|---|
| 4,068,387 A | * | 1/1978 | Manos .......................... 34/352 |
| 4,876,801 A | * | 10/1989 | Gehring et al. ................ 34/340 |
| 5,403,514 A | | 4/1995 | Matsuhisa et al. |
| 5,571,337 A | | 11/1996 | Mohindra et al. |
| 5,685,086 A | | 11/1997 | Ferrell |
| 5,685,327 A | | 11/1997 | Mohindra et al. |
| 5,776,296 A | | 7/1998 | Matthews |

FOREIGN PATENT DOCUMENTS

| | | |
|---|---|---|
| WO | WO 96/22356 | 7/1996 |
| WO | WO 96/36688 | 11/1996 |

OTHER PUBLICATIONS

Ellis B.N., "Cleaniung and Contamination of Electronics Components and Assemblies", Eletrochemical Publications Limited, Scotland, 1986, Chapters 7, 16, 17 and 30.
Warren K.J , Owens J.G., "The Use of New Fluorinated Solvents in Cleaning, Coating, and Manufacturing Operations," Proceesings of the Technical Program, NEPCON West '96 Conference, vol. 1, 1996, pp. 38993, Feb. 25–29, 1996.
HFE–7200 3M Product Bulletin, Aug. 1999.
Declaration Under 1 132 by John G. Owens, Oct. 17, 2001.

* cited by examiner

*Primary Examiner*—Kiley Stoner

(57) ABSTRACT

Method and apparatus for drying and/or cleaning a workpiece, such as an electronic part, semiconductor wafer, printed circuit board or the like. As the workpiece is withdrawn from a processing liquid, a selected drying liquid, such as hydrofluoroether (HFE), ethylated HFE, an HFE azeotrope or an ethylated HFE azeotrope, that has a very small surface tension, is volatile, and has a density that is greater than the processing liquid density, is sprayed on, dribbled on or otherwise transferred to an exposed surface of the workpiece. The exposed surface may be stationary, may be rotating or may be moving along a selected path. The workpiece can be dried in 5–60 seconds, or less, in most situations and can be cleaned using the invention. Drying and/or cleaning can be performed in a single workpiece process, a single workpiece continuous process or a batch process.

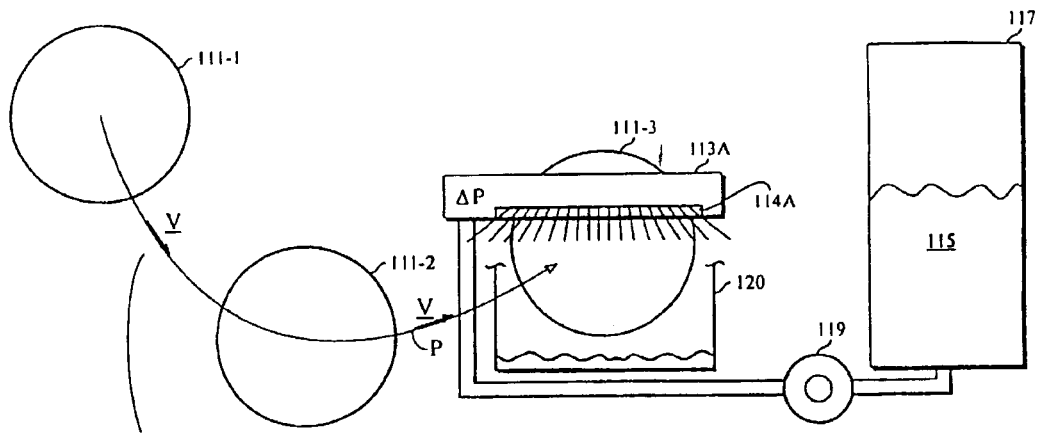

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–13, 15–18, 21–25 and 27–44 is confirmed.

Claim 14 is cancelled.

Claims 19 and 26 are determined to be patentable as amended.

Claim 20, dependent on an amended claim, is determined to be patentable.

New claim 45 is added and determined to be patentable.

19. The method of claim 17, further comprising the steps of:
  directing a second sheet of said [second] liquid in a selected direction toward a second exposed surface of said workpiece so that second selected region, having a second selected orientation relative to a vertical direction, of the second exposed surface is wetted by the second sheet of said [second] liquid; and
  moving at least one of said workpiece and the second sheet of said [second] liquid so that substantially all regions of the second exposed surface of said workpiece are wetting by the second sheet of said [second] liquid.

26. The method of claim 14, wherein said step of transferring said [second] liquid to said exposed surface of said workpiece comprises:
  rotating said exposed surface at a selected angular velocity about a selected rotation axis that passes through said exposed surface;
  immersing said exposed surface in said [second] liquid for a selected processing time interval whose length lies in a range of 5–60 seconds; and
  removing said exposed surface from said [second] liquid.

45. *A method for cleaning a workpiece, the method comprising the steps of:*
  *spraying on at least one exposed surface of the workpiece a processing liquid, where the processing liquid has a surface tension that is less than 17 dynes/cm and has a liquid density that is much greater than the density of water;*
  *whereby contaminants on at least one exposed surface of the workpiece are removed from the at least one exposed surface; and*
  *choosing said processing liquid from the class consisting of hydrofluoroether, an azeotrope of hydrofluoroether, an ethylated hyrdrofluoroether and an azeotrope of an ethylated hydrofluoroether, maintained at a selected temperature in the range 20–60° C.*

* * * * *